US006200727B1

(12) United States Patent
Urano et al.

(10) Patent No.: US 6,200,727 B1
(45) Date of Patent: Mar. 13, 2001

(54) POSITIVE PHOTOSENSITIVE COMPOSITION, POSITIVE PHOTOSENSITIVE LITHOGRAPHIC PRINTING PLATE AND METHOD FOR FORMING A POSITIVE IMAGE

(75) Inventors: Toshiyuki Urano; Akihisa Murata; Etsuko Hino, all of Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/244,206

(22) Filed: Feb. 4, 1999

(30) Foreign Application Priority Data

Feb. 4, 1998 (JP) .................................................. 10-23103
Feb. 4, 1998 (JP) .................................................. 10-23104

(51) Int. Cl.[7] ..................................................... G03F 7/004
(52) U.S. Cl. ....................... 430/270.1; 430/190; 430/326; 430/905
(58) Field of Search .................................... 430/190, 192, 430/165, 270.1, 905, 326

(56) References Cited

U.S. PATENT DOCUMENTS

| | | | | |
|---|---|---|---|---|
| 3,628,953 | | 12/1971 | Brinckman . | |
| 3,645,733 | | 2/1972 | Brinckman et al. . | |
| 4,308,368 | * | 12/1981 | Kubo et al. | 525/504 |
| 4,708,925 | | 11/1987 | Newman . | |
| 5,372,046 | | 12/1994 | Kleven et al. . | |
| 5,437,952 | * | 8/1995 | Hirai et al. | 430/83 |
| 5,491,046 | | 2/1996 | Deboer et al. . | |
| 5,631,119 | | 5/1997 | Shinozaki . | |
| 5,641,608 | | 6/1997 | Graunwald et al. . | |
| 5,840,467 | | 11/1998 | Kitatani et al. . | |
| 6,060,217 | * | 5/2000 | Nguyen et al. | 430/302 |

FOREIGN PATENT DOCUMENTS

| | | |
|---|---|---|
| 0 631 189 | 12/1994 | (EP) . |
| 0 652 483 | 5/1995 | (EP) . |
| 0 823 327 | 2/1998 | (EP) . |
| 2 082 339 | 3/1982 | (GB) . |
| 9-43847 | 2/1997 | (JP) . |
| WO 96/20429 | 7/1996 | (WO) . |
| WO 97/07986 | 3/1997 | (WO) . |
| WO 97/39894 | 10/1997 | (WO) . |

* cited by examiner

*Primary Examiner*—John S. Chu
(74) *Attorney, Agent, or Firm*—Oblon, Spivak, McClelland, Maier & Neustadt, P.C.

(57) ABSTRACT

A positive photosensitive composition comprising an alkali-soluble resin having phenolic hydroxyl groups (a) and a photo-thermal conversion material (b), and not containing a quinonediazide compound, which contains an alkali-soluble resin having phenolic hydroxyl groups, of which at least some are esterified (a-1).

22 Claims, No Drawings

POSITIVE PHOTOSENSITIVE COMPOSITION, POSITIVE PHOTOSENSITIVE LITHOGRAPHIC PRINTING PLATE AND METHOD FOR FORMING A POSITIVE IMAGE

The present invention relates to a positive photosensitive composition useful for a lithographic printing plate, a color proof for print correction, a color filter resist for liquid crystal display, a resist for integrated circuits for semiconductor elements or a copper etching resist to be used for a printed wiring board or gravure plate making, and further relates to a photosensitive lithographic printing plate and a method for forming a positive image.

Heretofore, as a positive photosensitive composition capable of forming a positive image by irradiation of ultraviolet light through a silver salt masking film, followed by development, a system has been known which comprises an alkali-soluble resin and an o-quinonediazide group-containing compound as a photosensitivity-imparting component. It is considered that in such a system, upon irradiation of ultraviolet light absorbable by the o-quinonediazide group-containing compound, the diazo moiety will be decomposed to finally form a carboxylic acid, whereby the alkali-solubility of the photosensitive composition will increase, i.e. only the exposed portion will be dissolved in an alkali developer to form an image. Namely, this system is one wherein a component of the photosensitive composition undergoes a photochemical change and yet has a sensitivity to ultraviolet light (hereinafter referred to simply as "UV-sensitivity").

On the other hand, along with the progress in the image treating technology by computers, an attention has been drawn to a photosensitive or heat sensitive direct plate making system wherein a resist image is formed directly from digital image information by a laser beam or a thermal head without using a silver salt masking film. Especially, it has been strongly desired to realize a high resolution laser photosensitive direct plate making system employing a high power semiconductor laser or YAG laser, from the viewpoint of downsizing, the environmental light during the plate making operation and plate making costs.

As a technique relating to an image-forming method wherein laser photosensitivity is utilized, a technique has been proposed in which a chemical amplification type photoresist is combined with a long wavelength light ray absorbing dye. For example, JP-A-6-43633 discloses a positive photosensitive material wherein a certain specific squarilium dye is combined with a photo-acid-generator and a binder. Further, as a technique of this type, JP-A-7-20629 discloses a method for preparing a lithographic printing plate by exposing a photosensitive layer containing an infrared ray absorbing dye, latent Brønsted acid, a resol resin and a novolak resin, in an image pattern by e.g. a semiconductor laser, and JP-A-7-271029 discloses a similar method wherein a s-triazine compound is used instead of the above latent Brønsted acid. However, the photosensitive materials used in these conventional techniques have UV-sensitivity and accordingly have a difficulty in handling under white light.

Further, in connection with an image-forming technique involving a chemical change by thermal decomposition, JP-A-7-285275 discloses an image-recording material comprising a binder, a material which absorbs light and generates heat, and a material which is thermally decomposable and substantially lowers the solubility of the binder in a non-decomposed state (hereinafter referred to as a thermally decomposable solubility-suppressing agent). In this publication, it is disclosed to use an onium salt, a diazonium salt or a quinonediazide compound, as the thermally decomposable solubility-suppressing agent. However, it is well known that each of such compounds has UV-sensitivity and thus has a difficulty in handling under white light. Further, this publication discloses a quinonediazide sulfuric acid ester of a certain type of a resin, such as a pyrogallol acetone resin, as a compound falling within a concept of an ester of a resin. However, the ester of a resin disclosed in this publication is nothing more than one disclosed as a type of a quinonediazide compound.

On the other hand, as an image-forming material having no UV-sensitivity and involving substantially no chemical change, the following may, for example, be mentioned.

Firstly, JP-A-9-43847 discloses a resist material wherein the crystallizability of the photosensitive material is changed by heating by irradiation with infrared rays, and a method for forming a pattern utilizing such a resist material.

Further, the present applicants have previously proposed a photosensitive composition comprising a photo-thermal conversion material and an alkali-soluble resin, whereby a positive image can be formed with a very simple system where no chemical change can be expected (U.S. patent application Ser. No. 08/906,258). This image formation is carried out by a change other than a chemical change. This is evident also from a reversible phenomenon observed such that when the photosensitive composition used which was once subjected to irradiation with light, is heated at a temperature of about 50° C. for 24 hours, the alkali solubility at the exposed portion which once increased immediately after the exposure often returns to a state close to the state before the exposure. Further, this is also evident from the relation between the glass transition temperature (or the softening point) of the photosensitive composition used and the likeliness of the reversible phenomenon, such that the lower the glass transition temperature (or the softening temperature), the more likely the reversible phenomenon.

The reason as to why the above-mentioned photosensitive composition forms such a positive image, is not clearly understood. However, it is considered that light energy absorbed by the photo-thermal conversion material is converted to heat, and the alkali-soluble polymer material at the portion receiving the heat undergoes a certain change other than the chemical change, such as a conformation change, whereby the alkali solubility at that portion will increase to facilitate formation of an image by the alkali developer.

In said application, the present applicants have further proposed sulfonic acid esters, etc., as solubility-suppressing agents for said composition.

However, such a composition is required to be further improved with respect to the sensitivity, the development latitude attributable to a difference in solubility between the exposed portion and the non-exposed portion, the strength of the photosensitive layer and the printing resistance.

Further, as a photosensitive composition having no sensitivity to UV, similar to the above, WO97/39894 discloses a lithographic printing plate capable of forming a positive image by irradiation with a laser beam of at least 600 nm, followed by development with an alkali developer. For example, it is disclosed to form a positive image by subjecting a lithographic printing plate having a photosensitive layer containing a novolak resin, a certain IR-absorbing agent and ethyl p-toluenesulfonate, to laser exposure. However, as a result of a study by the present inventors, it has been found that when the sulfonic acid ester disclosed in this publication is used, the film strength tends to be weak, and the printing resistance tends to be inadequate, although a positive image may be formed.

It is an object of the present invention to provide a positive photosensitive composition, a positive photosensitive lithographic printing plate and a method for forming a positive image, whereby the sensitivity is high, the chemical resistance of the image area is high, the film strength of the photosensitive layer is high, and high printing resistance can be obtained. A further object of the present invention is to provide a positive photosensitive composition, a positive photosensitive lithographic printing plate and a method for forming a positive image, which present high sensitivity to a near infrared laser.

Another object of the present invention is to provide a positive photosensitive lithographic printing plate excellent in handling under white light.

A still further object of the present invention is to provide a positive photosensitive lithographic printing plate having no stain at a non-image area during printing.

In a still further aspect, the present invention provides a method for forming a positive image, which comprises subjecting such a positive photosensitive lithographic printing plate to exposure with a laser beam having a wavelength within a range of from 650 to 1,300 nm, and then developing it with an alkali developer to form a positive image.

The present invention provides a positive photosensitive composition comprising an alkali-soluble resin and a photo-thermal conversion material as the main components, which involves substantially no chemical change in the image formation (i.e. which does not contain a compound decomposable by light or heat, such as a quinonediazide compound, as a component of the photosensitive composition), wherein at least some of phenolic hydroxyl groups in the alkali-soluble resin are esterified, and it has been found that a positive photosensitive lithographic printing plate having a layer of such a positive photosensitive composition on a substrate, has excellent printing resistance.

Further, it has been found that when a specific ester is selected for the ester moiety of the above alkali-soluble resin, it is possible to prevent staining during printing, in addition to the effect for printing resistance.

Namely, the present invention provides a positive photosensitive composition comprising an alkali-soluble resin having phenolic hydroxyl groups (a) and a photo-thermal conversion material (b), and not containing a quinonediazide compound, which contains an alkali-soluble resin having phenolic hydroxyl groups, of which at least some are esterified (a-1).

In another aspect, the present invention provides a positive photosensitive composition comprising an alkali-soluble resin having phenolic hydroxyl groups, of which at least some are esterified, a non-esterified alkali-soluble resin and a photo-thermal conversion material, which has substantially no photosensitivity to ultraviolet light.

In a further aspect, the present invention provides a positive photosensitive lithographic printing plate having a layer made of the above positive photosensitive composition formed on a substrate.

The esterification ratio of phenolic hydroxyl groups in the resin component of the photosensitive composition (the ratio of esterified phenolic hydroxyl groups to the entire phenolic hydroxyl groups present in the original resin) is usually from 1 to 40%, whereby the effects for printing resistance and suppression of staining during printing can be increased. The esterification ratio is more preferably from 2 to 30%, most preferably from 5 to 15%.

To obtain a positive photosensitive composition wherein the esterification ratio of the alkali-soluble resin having phenolic hydroxyl groups is set within the above range, it is possible to use one alkali-soluble resin wherein phenolic hydroxyl groups are esterified in a constant proportion. Otherwise, it is also possible to mix an alkali-soluble resin which is not substantially esterified and an alkali-soluble resin which is esterified in a constant proportion (usually with an esterification ratio of from 1 to 40%) for use. Usually, the latter is better in that preparation of the composition is easy. accordingly, the present invention will be described hereinafter with reference to a case wherein an alkali-soluble resin which is not substantially esterified and an alkali-soluble resin which is esterified, are mixed.

In this specification, the compound which is an alkali-soluble resin (a) having phenolic hydroxyl groups and of which at least some of the phenolic hydroxyl groups are esterified (a-1), is referred to as "an esterified alkali-soluble resin (a-1)". Further, a compound which is an alkali-soluble resin having phenolic hydroxyl groups and of which the phenolic hydroxyl groups are not substantially esterified, is referred to as "a non-esterified alkali-soluble resin".

Firstly, the non-esterified alkali-soluble resin will be described. Any one of known such alkali-soluble resins having phenolic hydroxyl groups may be employed. More specifically, a novolak resin, a resol resin, a polyvinylphenol resin, or a copolymer of an acrylic acid derivative having phenolic hydroxyl groups, may, for example, be mentioned. Among them, a novolak resin, a resol resin or a polyvinylphenol resin is preferred. More preferred is a novolak resin or a polyvinylphenol resin, and particularly preferred is a novolak resin. The weight average molecular weight (Mw) of the non-esterified alkali-soluble resin is usually from 1,000 to 1,000,000, preferably from 1,000 to 200,000.

The novolak resin may be one obtained by polycondensing at least one member of aromatic hydrocarbons such as phenol, m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol and 2-naphthol, with at least one aldehyde or ketone selected from aldehydes such as formaldehyde, acetaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used. The weight average molecular weight calculated as polystyrene, measured by gel permeation chromatography (hereinafter referred to simply as GPC) of the novolak resin (the weight average molecular weight by GPC measurement will hereinafter be referred to simply as Mw) is preferably from 1,000 to 100,000, more preferably from 1,500 to 50,000, most preferably from 2,000 to 20,000.

Preferred may be a novolak resin obtained by polycondensing at least one phenol selected from phenol, o-cresol, m-cresol, p-cresol, 2,5-xylenol, 3,5-xylenol and resorcinol, as the aromatic hydrocarbons for the novolak resin, with at least one member selected from aldehydes such as formaldehyde, acetaldehyde and propionaldehyde.

Particularly preferred is a novolak resin which is a polycondensate of a phenol mixture of m-cresol/p-cresol/2,5-xylenol/3,5-xylenol/resorcinol in a molar ratio of 40 to 100/0 to 50/0 to 20/0 to 20/0 to 20 or a phenol mixture of phenol/m-cresol/p-cresol in a molar ratio of 1 to 100/0 to 70/0 to 60, with aldehydes. Among aldehydes, formaldehyde is particularly preferred. The photosensitive composition of the present invention may further contain a solubility-suppressing agent, and in such a case, preferred is a novolak resin which is a polycondensate of a phenol mixture of m-cresol/p-cresol/2,5-xylenol/3,5-xylenol/resorcinol in a molar ratio of from 70 to 100/0 to 30/0 to 20/0 to 20, or a phenol mixture of a phenol/m-cresol/p-cresol in a molar ratio of 10 to 100/0 to 60/0 to 40, with aldehydes.

The polyvinylphenol resin may be a polymer of one or more hydroxystyrenes such as o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. The hydroxystyrenes may have a substituent, such as a halogen such as chlorine, bromine, iodine or fluorine, or a $C_{1-4}$ alkyl substituent, on the aromatic ring. Thus, the polyvinylphenols may be polyvinylphenols having a halogen or a $C_{1-4}$ alkyl substituent on the aromatic ring.

The polyvinylphenol resin is usually obtained by polymerizing one or more hydroxystyrenes which may have a substituent, in the presence of a radical polymerization initiator or a cation polymerization initiator. Such a polyvinylphenol resin may be one subjected to partial hydrogenation.

Mw of the polyvinylphenol resin is preferably from 1,000 to 100,000, more preferably from 1,500 to 50,000.

If Mw of the above novolak resin or polyvinylphenol resin is smaller than the above-mentioned range, no adequate coating film tends to be obtained, and if it exceeds such a range, the solubility of the non-exposed portion-in-an alkali developer tends to be small, whereby a pattern tends to be hardly obtainable.

The resol resin can be obtained in the same manner as for the preparation of the novolak resin except that instead of using an acid catalyst, an alkali catalyst is employed, and the preferred molecular weight and monomer composition for condensation polymerization are the same as those for the novolak resin.

The blend ratio of the non-esterified alkali-soluble resin is usually from 10 to 95 wt %, preferably from 20 to 95 wt %, more preferably from 40 to 90 wt %, based on the total solid content in the photosensitive composition.

The composition of the present invention may contain an alkali-soluble resin having no phenolic hydroxyl groups within a range not to impair the performance of the present invention.

The near infrared photo-thermal conversion material (b) (hereinafter referred to simply as a photo-thermal conversion material) to be used for the positive photosensitive composition of the present invention is not particularly limited so long as it is a material which generates heat by irradiation at the time of the image exposure. Specifically, it may, for example, be an organic or inorganic pigment, an organic dye or a metal, which has an absorption band covering a part or whole of a wavelength region of from 650 to 1,300 nm. More specifically, it may, for example, be carbon black, graphite, a metal such as titanium or chromium, a metal oxide such as titanium oxide, tin oxide, zinc oxide, vanadium oxide or tungsten oxide, a metal carbide such as titanium carbide, a metal boride, or a black or green organic pigment such as an inorganic black pigment disclosed in JP-A-4-322219, an azo-type black pigment, "Lionol Green 2YS" or "Green pigment 7". The above carbon black may, for example, be a commercial product of Mitsubishi Chemical Corporation such as "MA-7", "MA-100", "MA-200", "#5", "#10" or "#40", or a commercial product of Degussa such as "Color Black FW2", "FW20" or "Printex V".

Further, dyes having absorption bands in a near infrared region as disclosed in e.g. "Special Functional Dyes" (compiled by Ikemori and Hashiraya, 1986, published by Kabushiki Kaisha CMC), "Chemistry of Functional Dyes" (compiled by Higaki, 1981, published by Kabushiki Kaisha CMC), "Dye Handbook" (compiled by Okawa, Hirajima, Matsuoka and Kitao published by Kodansha), a catalogue published by Japan Photosensitive Dye Research Center in 1995, and a laser dye catalogue published by Exciton Inc., 1989, may be mentioned.

Still further, organic dyes as disclosed in JP-A-2-2074, JP-A-2-2075, JP-A-2-2076, JP-A-3-97590, JP-A-3-97591, JP-A-3-63185, JP-A-3-26593 and JP-A-3-97589, may be mentioned. Further, near infrared photo-thermal conversion materials as disclosed in JP10-93179, JP10-163444 and JP10-222567, may also be mentioned. A preferred near infrared photo-thermal conversion material in the present invention is a near infrared cyanine dye, which is a so-called cyanine dye in a broad sense which has a structure having a hetero atom such as a nitrogen atom, an oxygen atom or a sulfur atom bonded by a polymethine $(-CH=)_n$. For example, it includes various dyes such as a quinone type (a so-called cyanine type), an indole type (a so-called indocyanine type), a benzothiazole type (a so-called thiocyanine type), an iminocyclohexadiene type (a so-called polymethine type), a pyrylium type, a thiapyrylium type, a squarilium type, a croconium type and an azulenium type. Among them, a quinoline type, an indole type, a benzothiazole type, an iminocyclohexadiene type, a pyrylium type or a thiapyrylium type is preferred.

In the present invention, among the above cyanine dyes, a quinoline dye of the following formula (Ia), (Ib) or (Ic) is preferred.

(Ia)

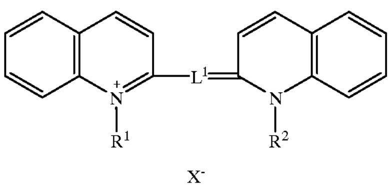

(Ib)

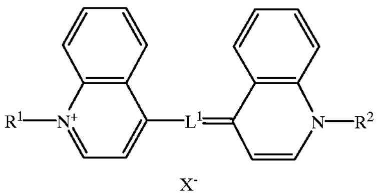

(Ic)

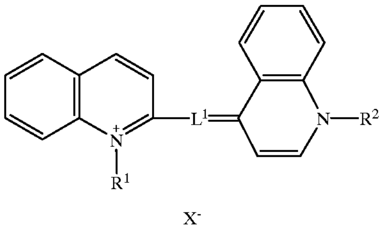

In the formulae (Ia), (Ib) and (Ic), each of $R^1$ and $R^2$ which are independent of each other, is an alkyl group which may have a substituent, an alkenyl group which may have a substituent, an alkynyl group which may have a substituent, or a phenyl group which may have a substituent, $L^1$ is a tri-, penta- or hepta-methine group which may have a substituent, wherein two substituents on the penta- or hepta-methine group may be linked to each other to form a $C_{5-7}$ cycloalkene ring, the quinoline ring may have substituents, wherein adjacent two substituents may be linked to each other to form a condensed benzene ring, and $X^-$ is a counter anion.

Here, the substituent in $R^1$ and $R^2$ in the formulae (Ia), (Ib) and (Ic) may, for example, be an alkoxy group, a phenoxy group, a hydroxy group or a phenyl group, and the substituent in $L^1$ may, for example, be an alkyl group, an amino group or a halogen atom. Likewise, the substituent in the quinoline ring may, for example, be an alkyl group, an alkoxy group, a nitro group or a halogen atom.

As the indole type and benzothiazole type dyes, those represented by the following formula (II) are preferred.

(II)

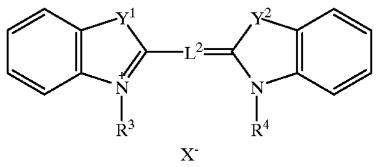

In the formula (II), each of $Y^1$ and $Y^2$ which are independent of each other, is a dialkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta- or hepta-methine group which may have a substituent, wherein two substituents on the penta- or hepta-methine group may be linked to each other to form a $C_{5-7}$ cycloalkene ring, the condensed benzene ring may have substituents, wherein adjacent two substituents may be linked to each other to form a condensed benzene ring, and $X^-$ is a counter anion.

Here, the substituent in $R^3$ and $R^4$ in the formula (II) may, for example, be an alkoxy group, a phenoxy group, a hydroxyl group or a phenyl group, the substituent in $L^2$ may, for example, be an alkyl group, an amino group or a halogen atom, and the substituent in the benzene ring may, for example, be an alkyl group, an alkoxy group, a nitro group or a halogen atom.

As the iminocyclohexadiene dyes, those represented by the following formula (III) are particularly preferred.

(III)

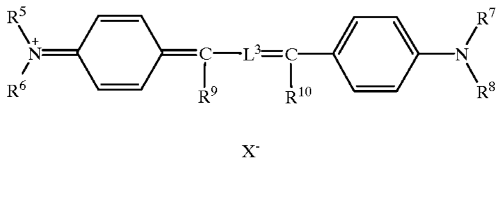

In the formula (III), each of $R^5$, $R^6$, $R^7$ and $R^8$ which are independent of one another, is an alkyl group, each of $R^9$ and $R^{10}$ which are independent of each other, is an aryl group which may have a substituent, a furyl group or a thienyl group, $L^3$ is a mono-, tri- or penta-methine group which may have a substituent, wherein two substituents on the tri- or penta-methine group may be linked to each other to form a $C_{5-7}$ cycloalkene ring, and $X^-$ is a counter anion.

Here, each of $R^9$ and $R^{10}$ in the formula (III) may specifically be, for example, a phenyl group, a 1-naphthyl group, a 2-naphthyl group, a 2-furyl group, a 3-furyl group, a 2-thienyl group or a 3-thienyl group, and the substituent thereon may, for example, be an alkyl group, an alkoxy group, a dialkylamino group, a hydroxyl group or a halogen atom, and the substituent in $L^3$ may, for example, be an alkyl group, an amino group or a halogen atom.

As the pyrylium type and thiapyrylium dyes, those represented by the following formula (IVa), (IVb) or (IVc) are particularly preferred.

(IVa)

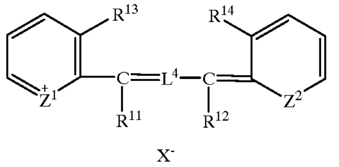

(IVb)

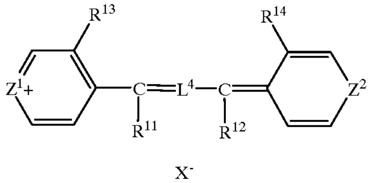

(IVc)

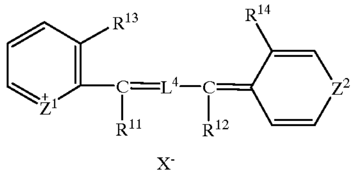

In the formulae (IVa), (IVb) and (IVc), each of $Z^1$ and $Z^2$ which are independent of each other, is an oxygen atom or a sulfur atom, each of $R^{11}$, $R^{12}$, $R^{13}$ and $R^{14}$ which are independent of one another, is a hydrogen atom or an alkyl group, or $R^{11}$ and $R^{13}$ , or $R^{12}$ and $R^{14}$, may be linked to each other to form a $C_5$ or $C_6$ cycloaklene ring, $L^4$ is a mono-, tri- or penta-methine group which may have a substituent, wherein two substituents on the tri- or penta-methine group may be linked to each other to form a $C_{5-7}$ cycloalkene ring, the pyrylium ring and the thiapyrylium ring may have substituents, wherein adjacent two substituents may be linked to each other to form a condensed benzene ring, and $X^-$ is a counter anion.

Here, the substituent in $L^4$ of the formulae (IVa), (IVb) and (IVc) may, for example, be an alkyl group, an amino group or a halogen atom, and the substituents in the pyrylium ring and the thiapyrylium ring may, for example, be an aryl group such as a phenyl group or a naphthyl group.

Now, specific examples will be shown for each of the quinoline dyes of the above formulae (Ia) to (Ic), the indole type or benzothiazole type dyes of the formula (II), the iminocyclohexadiene dyes of the formula (III) and the pyrylium type or thiapyrylium dyes of the formula (IVa) to (IVc).

(I-1)
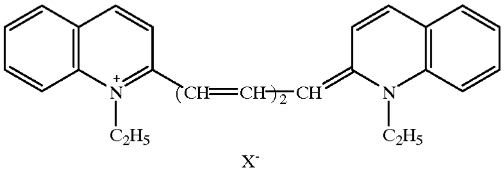
(I-2)
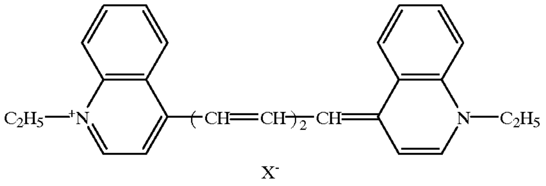
(I-3)
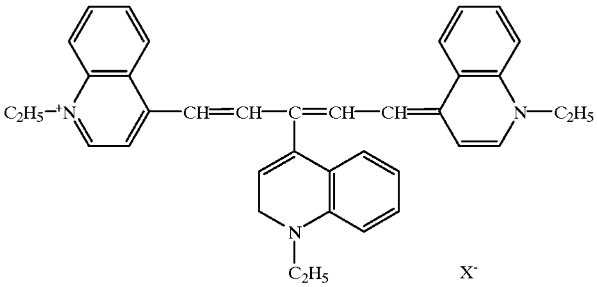
(I-4)
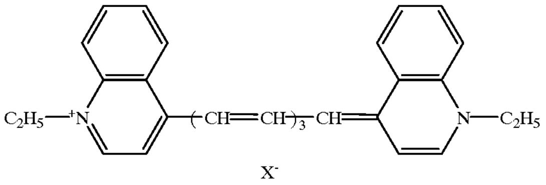
(II-1)
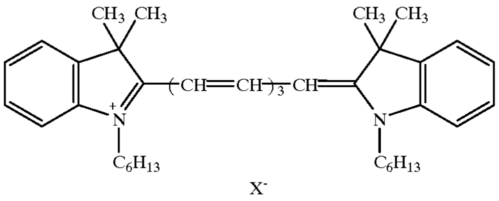
(II-2)
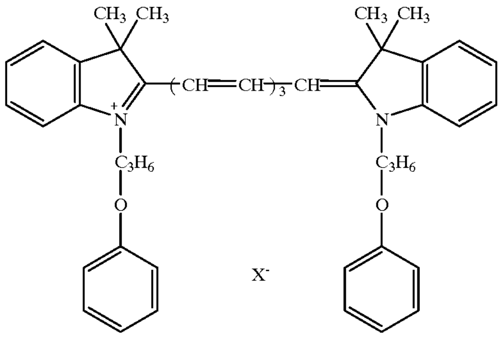
(II-3)
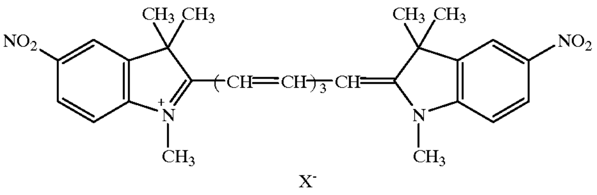
(II-4)
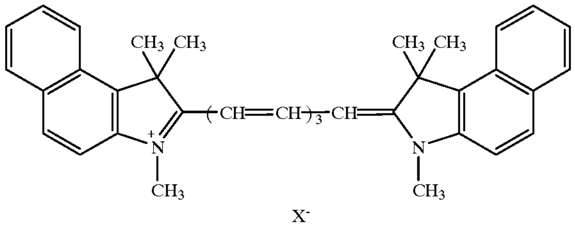
(II-5)
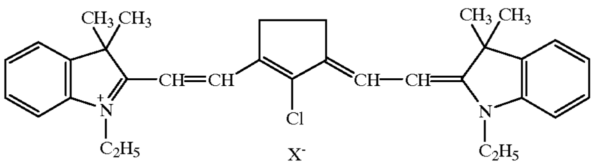
(II-6)
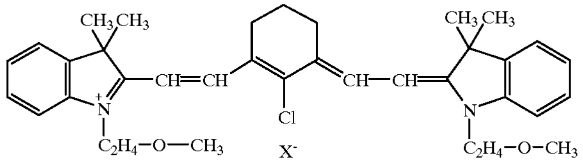

-continued
(II-7)
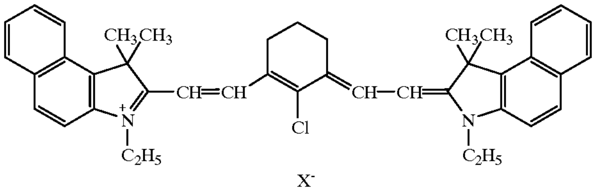
(II-8)
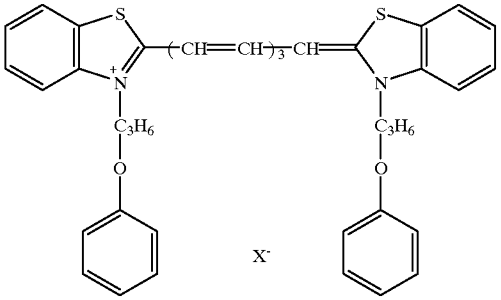
(II-9)
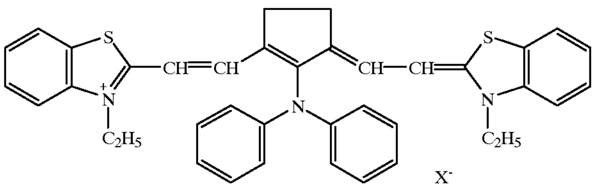
(II-10)
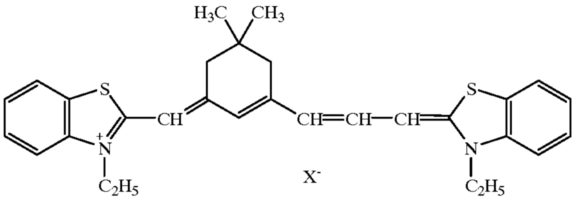
(III-1)
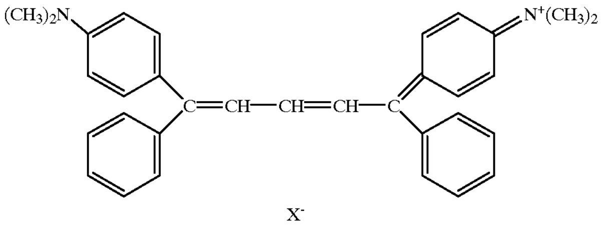
(III-2)
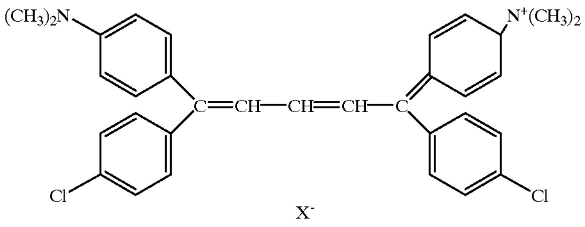
(III-3)
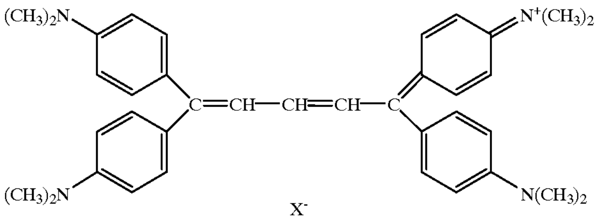
(III-4)
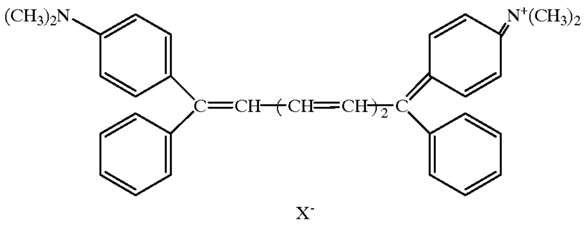
(III-5)
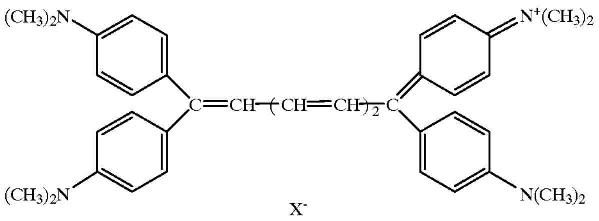
(III-6)
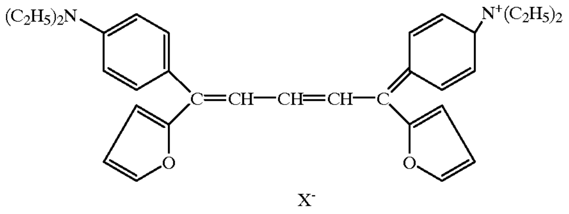

-continued
(IV-1)
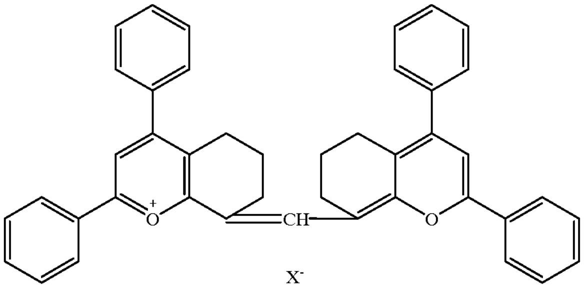
(IV-2)
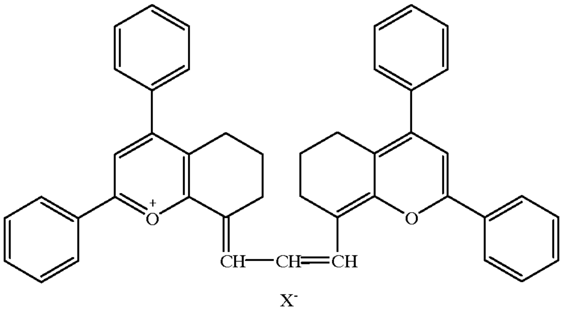
(IV-3)
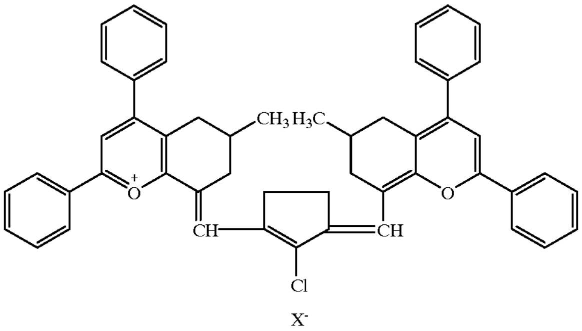
(IV-4)
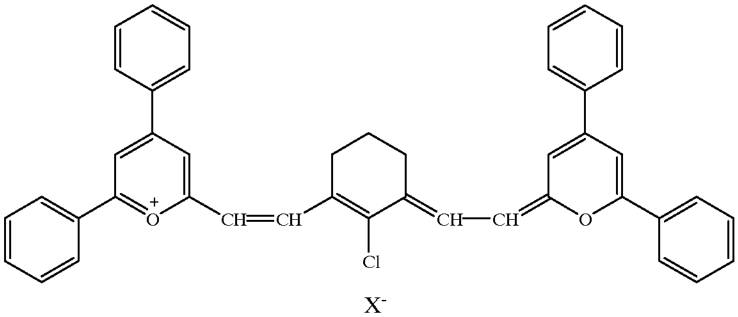
(IV-5)
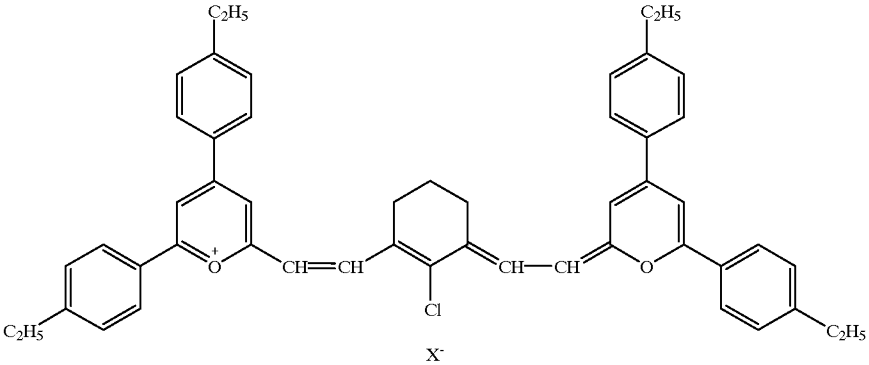

-continued
(IV-6)
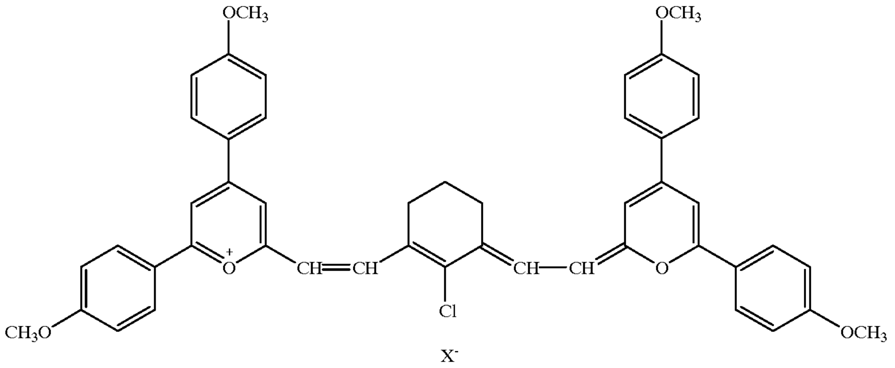
(IV-7)
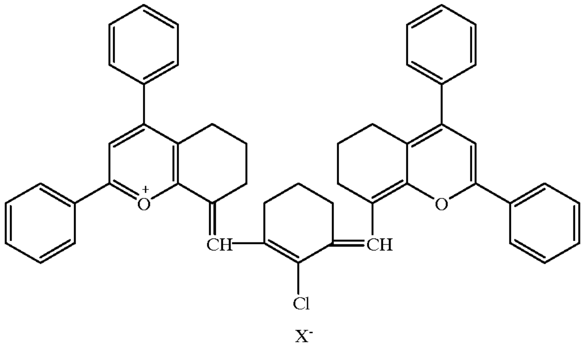
(IV-8)
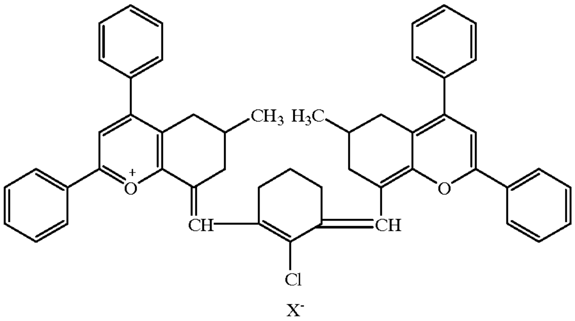
(IV-9)
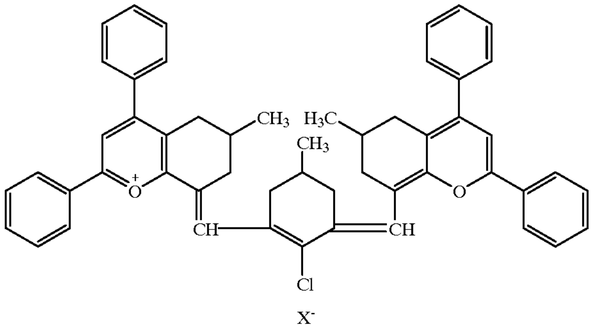
(IV-10)
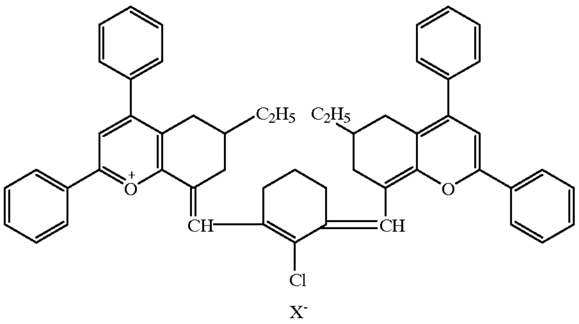
(IV-11)
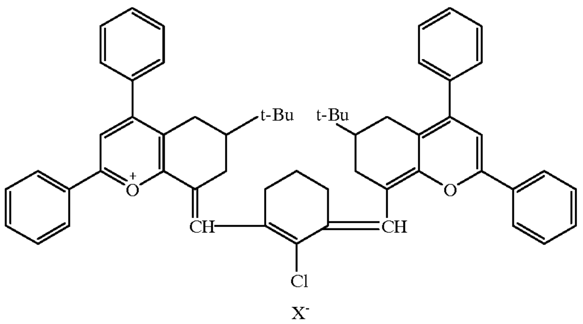

-continued
(IV-12)
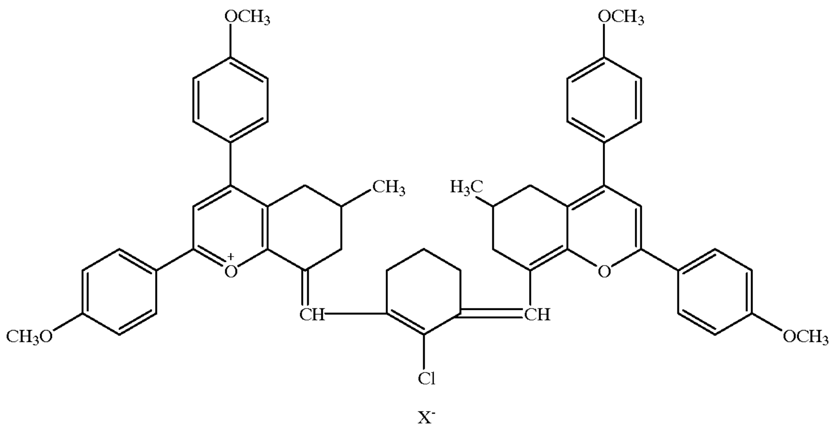
(IV-13)
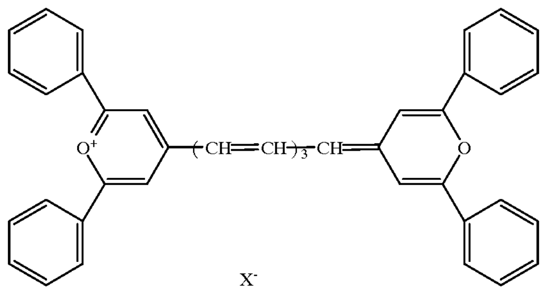
(IV-14)
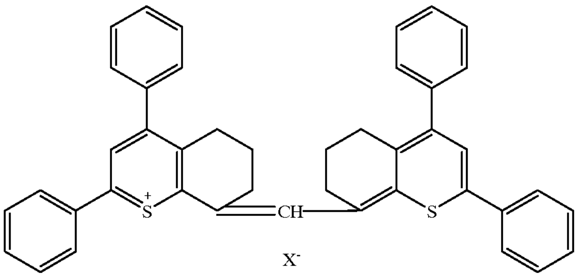
(IV-15)
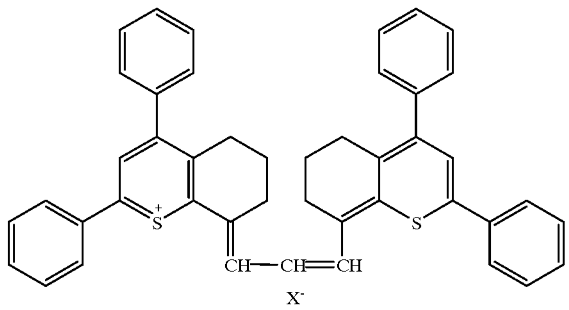
(IV-16)
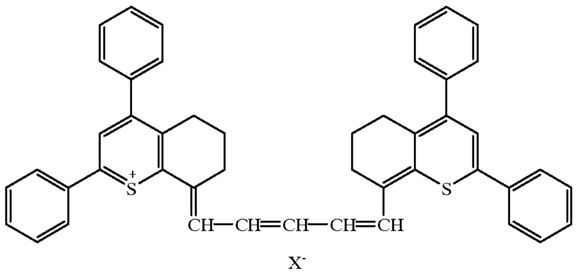
(IV-17)
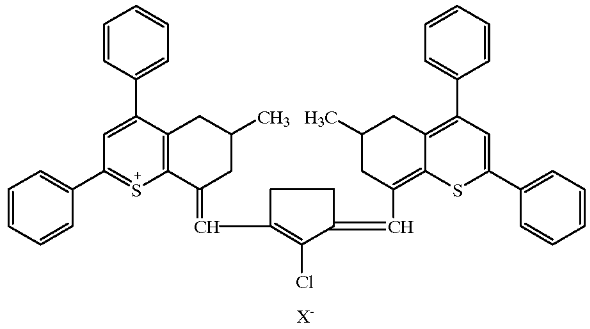
(IV-18)
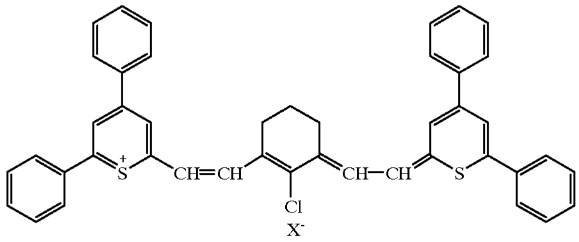

-continued
(IV-19)
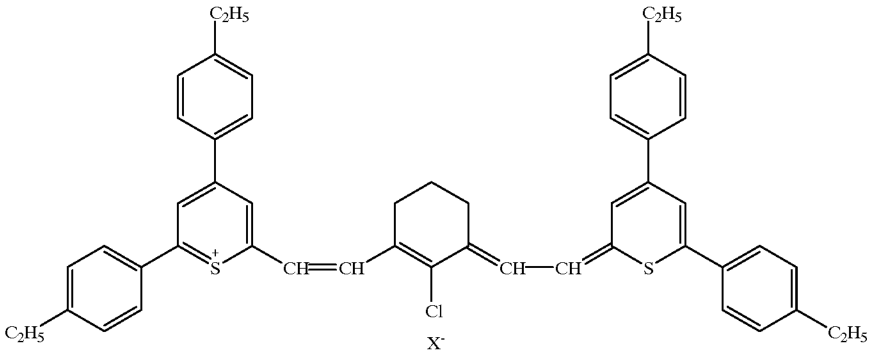
(IV-20)
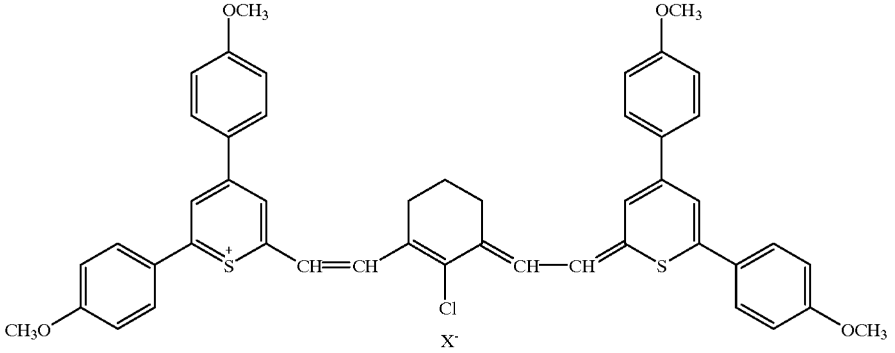
(IV-21)
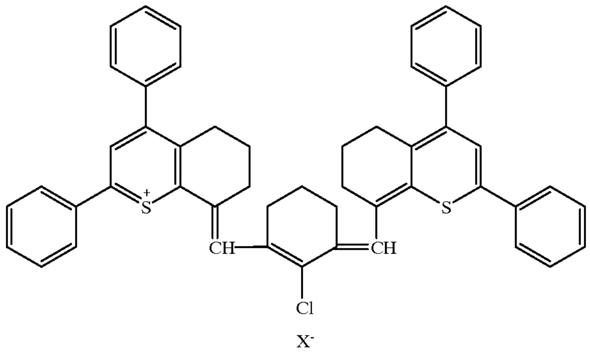
(IV-22)
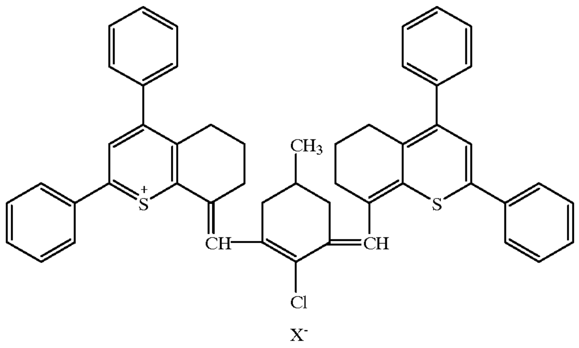
(IV-23)
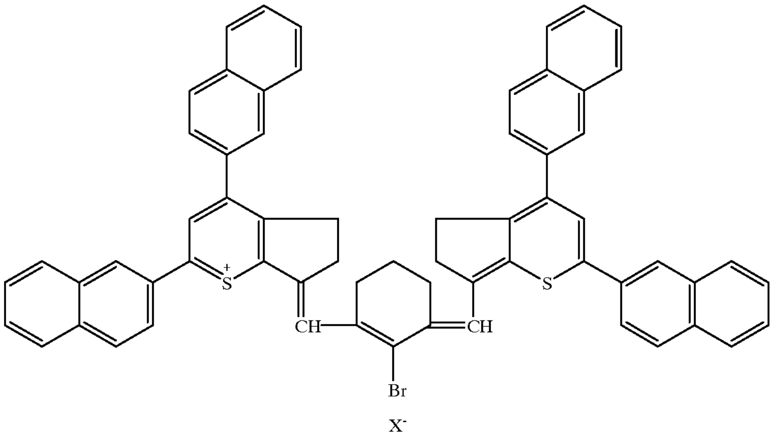

-continued (IV-24)

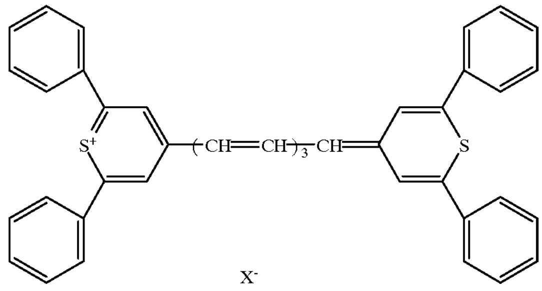

The counter anion $X^-$ in the foregoing will specifically be described. It may, for example, be an anion of an inorganic acid, such as $Cl^-$, $Br^-$, $I^-$, $ClO_4^-$, $BF_4^-$ or $PF_6^-$, or anion of an organic acid such benzenesulfonic acid, p-toluenesulfonic acid, naphthalenesulfonic acid, acetic acid or an organic boric acid.

Especially, a dye having an organic boric acid anion as the counter anion is preferred, since it is excellent in the solubility in the coating solvent, so that preparation of the coating solution will be facilitated, and it makes possible to use a solvent having a low boiling point, so that sticking of a non-dried photosensitive layer to e.g. a coating line roller can be prevented, and high speed coating will be possible, whereby high productivity can be attained.

Specifically, as such an organic boric acid anion, the one represented by the following formula (L) may be mentioned.

(L)

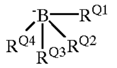

wherein each of $R^{Q1}$ to $R^{Q4}$ which are independent of one another, is a hydrogen atom, a $C_{1-15}$ alkyl group, a $C_{6-15}$ aromatic hydrocarbon group which may have a substituent, or a $C_{4-15}$ heterocyclic group which may have a substituent.

More specifically, it may be one wherein each of $R^{Q1}$ to $R^{Q4}$ which are independent of one another, is $—CH_3$, $—C_2H_5$, $—C_3H_7$, $—C_4H_9$, $—C_4H_9$-t,

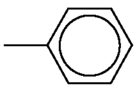 , 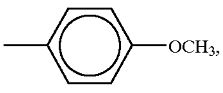 , 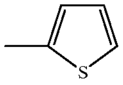 ,

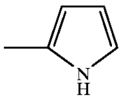 , 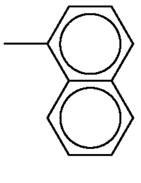 , 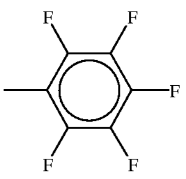 or

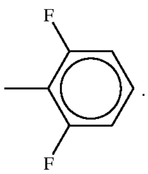 .

Further, as preferred specific examples other than the above cyanine dyes, the following may be mentioned:

S-1 Nigrosine dye: Color Index Solvent Black 5

S-2 Nigrosine dye: Color Index Solvent Black 7

S-3 Nigrosine dye: Color Index Acid Black 2

S-4 Carbon black: MA-100 (manufactured by Mitsubishi Chemical Corporation

S-5 Titanium monoxide: Titanium Black 13M (manufactured by Mitsubishi Material)

S-6 Titanium monoxide: Titanium Black 12S (manufactured by Mitsubishi Material)

Such a photo-thermal conversion material (b) is incorporated in a blend ratio of from 0.5 to 30 wt %, preferably from 1 to 20 wt %, more preferably from 1 to 15 wt %, based on the total solid content of the photosensitive composition of the present invention.

As mentioned above, the photosensitive composition of the present invention is one whereby image forming is carried out mainly by a change other than a chemical change, and it is essential that it has no UV sensitivity (i.e. handling in white light is possible). Accordingly, the photosensitive composition of the present invention does not contain a quinonediazide compound.

In the present invention, it is necessary to incorporate an esterified alkali-soluble resin (a-1) as an essential component. By the incorporation of the esterified alkali-soluble resin (a-1), the film strength of the photosensitive layer can be improved. Accordingly, this esterified alkali-soluble resin (i.e. the compound which is an alkali-soluble resin having phenolic hydroxyl groups and of which at least some of the phenolic hydroxyl groups are esterified) may sometimes be referred to as “a film strength-improving agent”.

The ester moiety of the esterified alkali-soluble resin (a-1) is preferably a sulfonic acid compound or a carboxylic acid compound. The alkali-soluble resin having phenolic hydroxyl groups, which constitutes the esterified alkali-soluble resin (a-1), may, for example, be a novolak resin, a resol resin, a polyvinylphenol resin or a copolymer of an acrylic acid derivative, having phenolic hydroxyl groups. Among them, a novolak resin, a resol resin or a polyvinylphenol resin is preferred.

Particularly preferred as a film strength-improving agent is an ester compound of a polycondensation resin of a phenol with an aldehyde or ketone, with a carboxylic acid compound or a sulfonic acid compound.

Such a phenol may, for example, be a monohydric phenol such as phenol, o-cresol, m-cresol, p-cresol, 3,5-xylenol, carvacrol or thymol, a dihydric phenol such as catechol, resorcinol or hydroquinone, or a trihydric phenol such as pyrogallol or phloroglucinol. The above aldehyde may, for example, be formaldehyde, benzaldehyde, acetaldehyde, crotonaldehyde or furfural. Among them, preferred is formaldehyde or benzaldehyde. The above ketone may, for example, be acetone or methyl ethyl ketone.

Specific examples of the above polycondensation resin include a phenol/formaldehyde resin, a m-cresol/formaldehyde resin, a m- and p-mixed cresol/formaldehyde resin, a resorcinol/benzaldehyde resin or a pyrogallol/acetone resin.

The molecular weight (Mw) of the alkali-soluble resin having phenolic hydroxyl groups, which constitutes the above-mentioned film strength-improving agent, is usually from 1,000 to 50,000, preferably from 1,500 to 20,000, more preferably from 2,000 to 10,000.

The esterification ratio of the sulfonic acid or carboxylic acid compound to the phenolic hydroxyl group of the above-mentioned film strength-improving agent (the reaction ratio per one OH group) is preferably from 1 to 40%, more preferably from 3 to 35%, most preferably from 15 to 35%.

The sulfonic acid or carboxylic acid compound may, for example, be a sulfonic acid compound or a carboxylic acid compound, such as a $C_{1-15}$ alkylsulfonic acid which may have a substituent, a $C_{5-20}$ arylsulfonic acid which may have a substituent, a quinonesulfonic acid which may have a substituent, a $C_{4-20}$ heterocyclic sulfonic acid which may have a substituent, or a carboxylic acid corresponding thereto.

More preferably, it may, for example, be a mono- to tri-cyclic arylsulfonic acid compound, a mono- to tri- cyclic quinonesulfonic acid compound or a carboxylic acid compound corresponding thereto, which may have an alkyl group, a carboxylic acid group, a hydroxyl group, a primary amino group, a secondary amino group or a tertiary amino group, as a substituent, in its structure. Particularly preferred is a mono- or bi-cyclic arylsulfonic acid or a bi- or tri-cyclic quinonesulfonic acid, which may have the above-mentioned substituent, since such a sulfonic acid is advantageous with a view to improvement of the printing resistance and chemical resistance.

A suitable sulfonic acid ester group (R—$SO_3$—) constituting the esterified alkali-soluble resin (a-1), may, for example, be a group wherein R has a structure represented by one of the following formulae $QP^1$ to $QP^9$.

$QP^1$

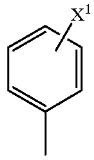

$QP^2$

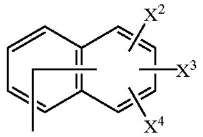

$QP^3$

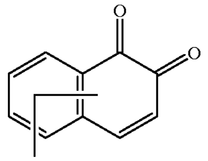

$QP^4$

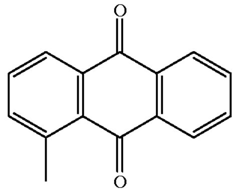

wherein $X^1$ is a hydrogen atom or an alkyl group, $X^2$ is a hydrogen atom or a hydroxyl group, $X^3$ is

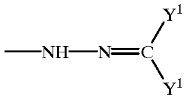

or —N═N—$Y^2$, $X^4$ is a hydrogen atom or an alkyl group, each of two $Y^1$ which are independent of each other, is a hydrogen atom, an alkyl group, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of them is a group selected from an acyl group, an alkoxycarbonyl group, an aryloxycarbonyl group, an allyloxycarbonyl group, a carboxylic acid group and a cyano group, and $Y^2$ is an aryl group which may have a substituent, an alkyl group which may have a substituent, a heterocyclic group which may have a substituent, an alkenyl group, an acyl group which may have a substituent, or an alkoxycarbonyl group which may have a substituent.

In the above definitions, the carbon number of the alkyl group is from 1 to 15, preferably from 1 to 6; the carbon number of the aryl group is from 6 to 20, preferably from 6 to 12; the carbon number of the heterocyclic group is from 4 to 20, preferably from 4 to 10; the carbon number of the alkenyl group is from 2 to 10, preferably from 2 to 6; the carbon number of the acyl group is from 2 to 15, preferably from 2 to 10; and the carbon number of the alkoxycarbonyl group is from 2 to 15, preferably from 2 to 10.

More specifically, examples of the esterified alkali-soluble resin (a-1) used in the present invention will be given below. When the stain resistance during printing, as described hereinafter, is taken into consideration, the following compounds may be mentioned as preferred examples as resins wherein o-quinonediazide groups have been non-photosensitized. However, the esterified alkali-soluble resin (a-1) of the present invention is not limited to such compounds.

Mw 4000

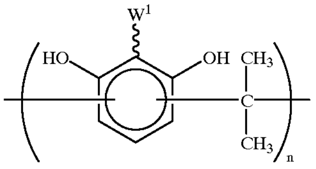

A compound (Mw 3000) having $W^1$ substituted for hydroxyl groups of a polycondensation novolak resin of m-cresol with formaldehyde (reaction ratio: 30%).

A compound (Mw 2000) having $W^1$ substituted for hydroxyl groups of a polycondensation novolak resin of phenol with formaldehyde (reaction ratio: 30%).

A compound (Mw 3000) having $W^1$ substituted for hydroxyl groups of a polycondensation novolak resin of m-resorcinol with formaldehyde (reaction ratio: 20%).

Here, $W^1$ is

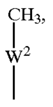

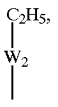

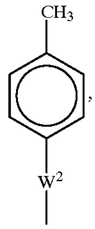

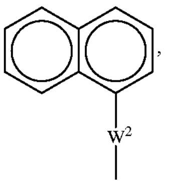

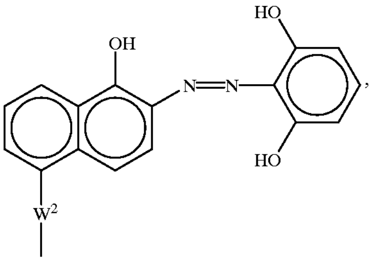

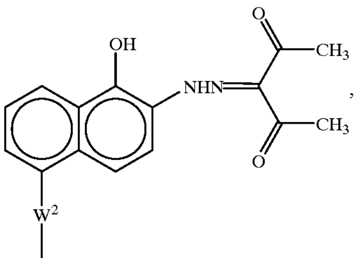

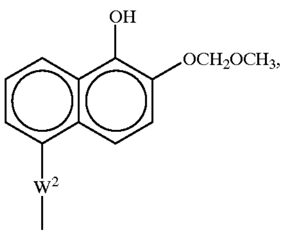

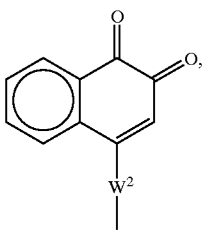

-continued

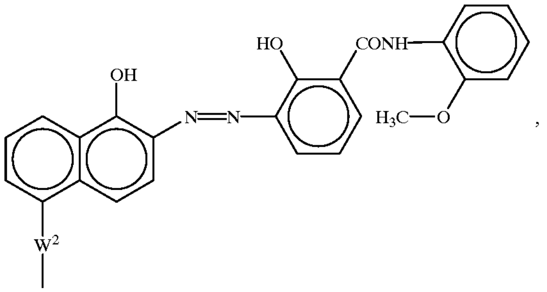

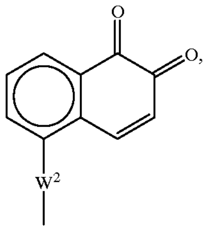

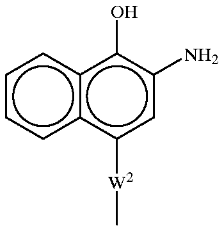

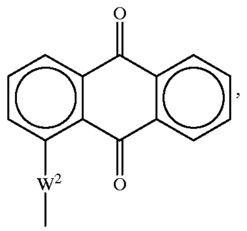

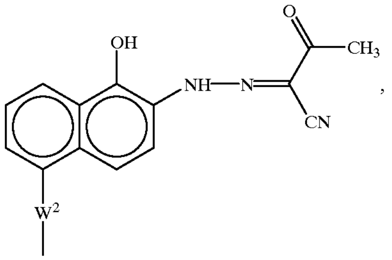

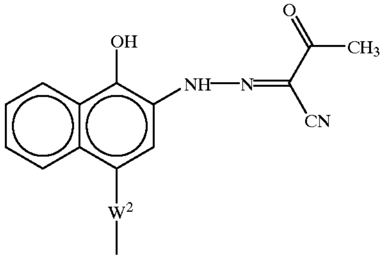

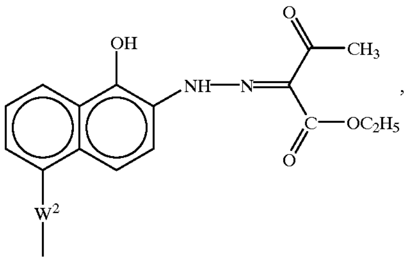

-continued

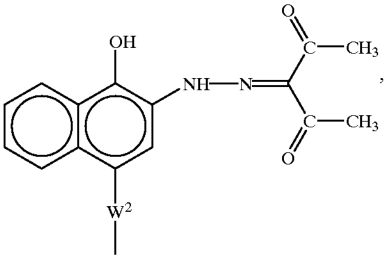

,

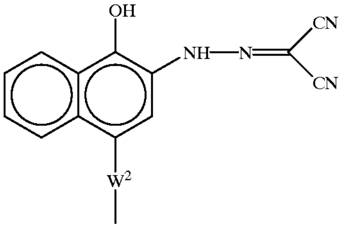

,

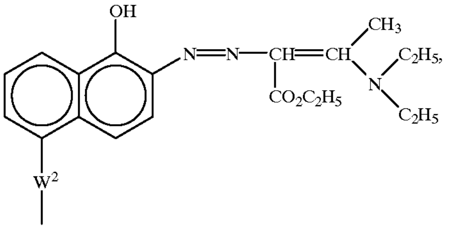

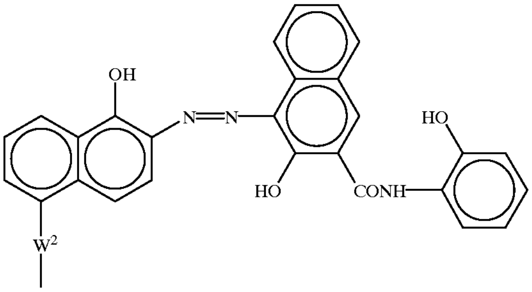

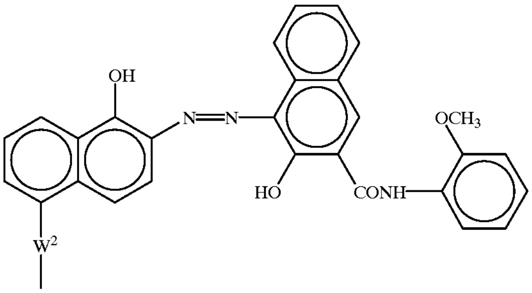

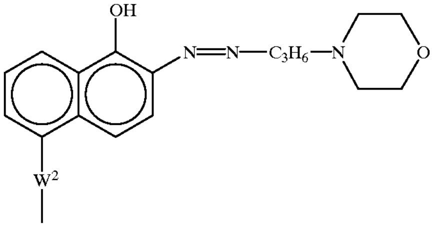

-continued

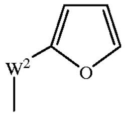

or

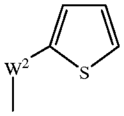

$W^2$ is

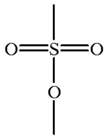

or

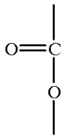

Among the above-mentioned esterified alkali-soluble resins (a-1), one obtainable by reacting a sulfonic acid compound with a pyrogallol/acetone resin is particularly preferred with a view to improvement of the printing resistance and chemical resistance when used for a lithographic printing plate.

Further, the blend ratio of the esterified alkali-soluble resin (a-1) is from 0.5 to 100 wt %, preferably from 0.5 to 50 wt %, more preferably from 1 to 30 wt %, based on the total solid content of the photosensitive composition.

By incorporating the film strength-improving agent of the present invention, removal of an exposed portion (a non-image area) and the film retention at an image area can be improved, and the printing resistance can be improved due to an improvement in the film strength of the photosensitive layer. This is considered to be attributable to the following mechanism.

Namely, in the photosensitive composition comprising the non-esterified alkali-soluble resin and the esterified alkali-soluble resin (a-1), the esterified alkali-soluble resin will be crosslinked by hydrogen bonds to the non-esterified alkali-soluble resin having phenolic hydroxyl groups to form a matrix structure by such bonds in the photosensitive layer. The matrix effect by such bonds can be confirmed by a decrease in the solubility of the photosensitive layer in an aqueous alkali solution.

Such crosslinking is usually hardly formed by merely mixing the non-esterified alkali-soluble resin and the film strength-improving agent, and the formation is accelerated usually by carrying out heat treatment. Thus, such crosslinking can be confirmed by the resulting decrease in the solubility of the photosensitive layer, improvement in the printing resistance of the photosensitive layer or a decrease of scratch mark defects.

The heat treatment is carried out usually at the time of drying after coating the photosensitive composition on a substrate or the like, and the temperature and time may suitably be selected to attain the performance for e.g. the solubility, printing resistance and prevention of scratch mark defects of the photosensitive layer. Preferably, the temperature is within a range of from 40 to 100° C., and the heat treatment time is prolonged as the temperature decreases. Specifically, it is preferred that the time is from 1 to 30 minutes in the vicinity of 100° C., or from 5 to 50 hours in the vicinity of 40° C.

If the temperature is too high or the time is too long for the heat treatment, the solubility of the photosensitive layer decreases, thus leading to development failure. On the other hand, if the temperature is too low or the time is too short for the heat treatment, the solubility of the photosensitive layer will be excessive, thus leading to dissolution of the image during development, formation of scratch marks or deterioration of the printing resistance.

The details of the mechanism for the improvement of the positive image-forming property by the photosensitive composition of the present invention are not clearly understood. However, it is considered that upon irradiation with light, the matrix structure by hydrogen bonds which produces the effect of suppressing the solubility, undergoes relaxation or dissolution of hydrogen bonds by the heat generated by light absorption, whereby penetration of the alkali agent will be facilitated, and the effect for suppressing the solubility will diminish, so that a positive image with a high contrast will be formed, and a wide development latitude will be given.

Further, it is considered that the film strength-improving agent having a high molecular weight alkali-soluble resin skeleton having phenolic hydroxyl groups, has a function to form a stronger matrix structure by hydrogen bonds and provides a higher effect for improving the film strength, as compared with the one having a low molecular weight.

On the other hand, the film strength-improving agent is preferably a resin which corresponds to an ester of an alkali-soluble resin having phenolic hydroxyl groups with an arylsulfonic acid and of which the partial structure constituting the ester i.e. the aromatic ring or a substituent on the aromatic ring of the arylsulfonic acid is substituted by a hydrophilic group, since such a resin has, in addition to the above-mentioned printing resistance and chemical resistance, an effect to prevent staining of a non-image area during printing (stain resistance). Such a hydrophilic group may, for example, be a hydroxyl group, a primary amino group, a secondary amino group, a tertiary amino group or a carboxylic acid group. Among them, one having at least hydroxyl group on the aromatic ring, is preferred. Particularly preferred is one having a hydroxyl group and an amino group on the aromatic ring. The amino group may have a substituent. It is considered that by the presence of a hydrophilic group in the partial structure constituting the ester, the solubility of an exposed portion of the photosensitive layer in an alkali developer will be facilitated in combination with the above-mentioned change in conformation.

The resin which is an ester of an alkali-soluble resin having phenolic hydroxyl groups with an arylsulfonic acid and which has a hydrophilic group in a partial structure constituting the ester, is prepared preferably by reacting an o-quinonediazide group moiety of a resin having a structure which corresponds to an ester of an alkali-soluble resin having phenolic hydroxyl groups with a conventional o-quinonediazide sulfonic acid such as 1,2-benzoquinonediazide-sulfonic acid or 1,2-benzoquinonediazidesulfonic acid, to modify the o-quinonediazide group and consequently to introduce a hydrophilic group into a partial structure constituting the ester, in view of the preparation efficiency and the production cost.

The above modification of the o-quinonediazide group is specifically such that the o-quinonediazide group is modified to a compound which does not undergo a photoreaction to form indenecarboxylic acid upon absorption of light with a wavelength of from 300 to 450 nm (i.e. non-photosensitized), and the compound no longer has a quinonediazide group. Such non-photosensitizing can be carried out by modifying the o-quinonediazide group by a known coupling reaction or nitrogen-removing reaction.

Particularly preferred is a resin having hydroxyl groups introduced by non-sensitizing a resin having a structure corresponding to an ester of a novolak resin, specifically a polycondensation resin of a phenol with an aldehyde or ketone, with o-naphthoquinone diazidesulfonic acid, more preferably a resin having a structure corresponding to an ester of a pyrogallol/acetone resin with 1,2-benzoquinonediazidesulfonic acid or 1,2-naphthoquinonediazidesulfonic acid, from the viewpoint of the synthesis and the above-mentioned printing resistance, chemical resistance and stain resistance.

Such non-sensitizing can be carried out by means of known methods as disclosed in e.g. Saul Patal, "The Chemistry of diazonium and diazo groups Part 1", 1978, published by John Wiley & Sons, Saul Patal, "The Chemistry of diazonium and diazo groups Part 2", 1978, published by John Wiley & Sons, Viadimir V. Ershov et al., "Quinone Diazides", 1981, published by Elsevier Scientific Publishing Company, W. Ried and M. Butz, Liebigs Ann. Chem., 716, 190 (1968); W. Ried and A. Keemann, Liebigs Ann. Chem., 689, 145 (1965), E. Bamberger, Marie Baum and Leo Schlein, J. Prakt. Chem., 266 (1923), E. Bamberger, and S. Wildi, J. Prakt. Chem., 278 (1923). As specific examples of such non-sensitizing reaction, the following reactions employing various acids, alkalis and metal catalysts, may be mentioned.

Q:

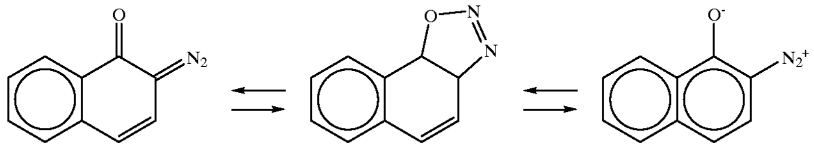

(α1)

Q

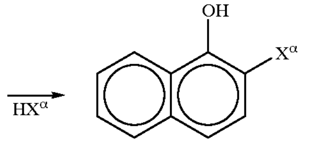

($X^{\alpha}$ is chlorine, bromine, fluorine, iodine or $NCS^-$.)

(α2)

Q

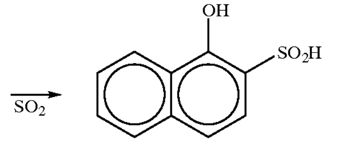

-continued
(α3)
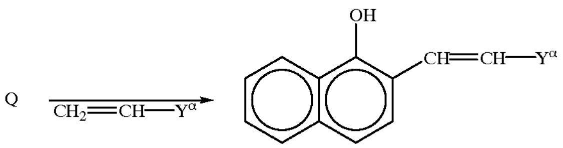
($Y^{\alpha}$ is a cyano groups, an acyl group or an aryl group.)
(α4)
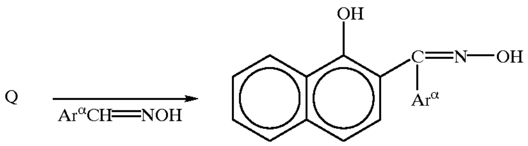
($Ar^{a}$ is an aryl group.)
(α5)
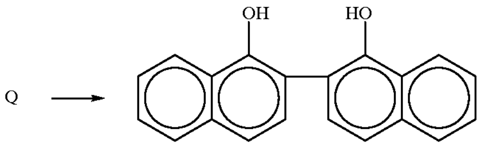
(α6)
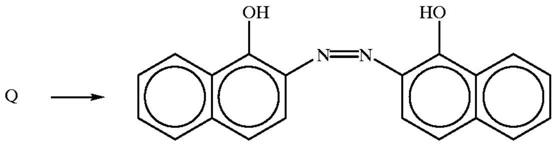
(α7)
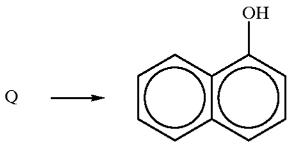
(α8)
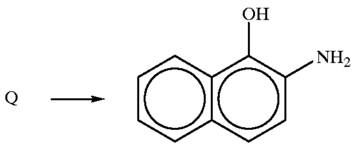
(α9)
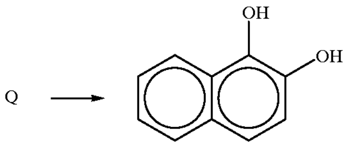
(α10)
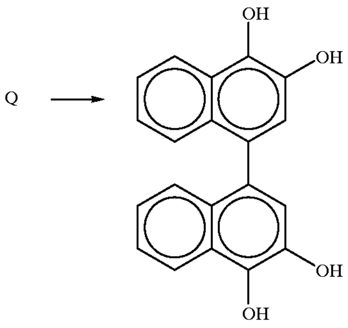

-continued (α11)

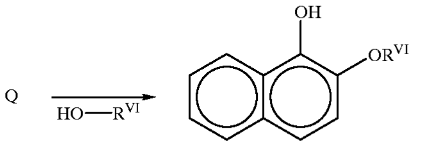

($R^{VI}$ is an alkyl group which may have a substituent.)

(α12)

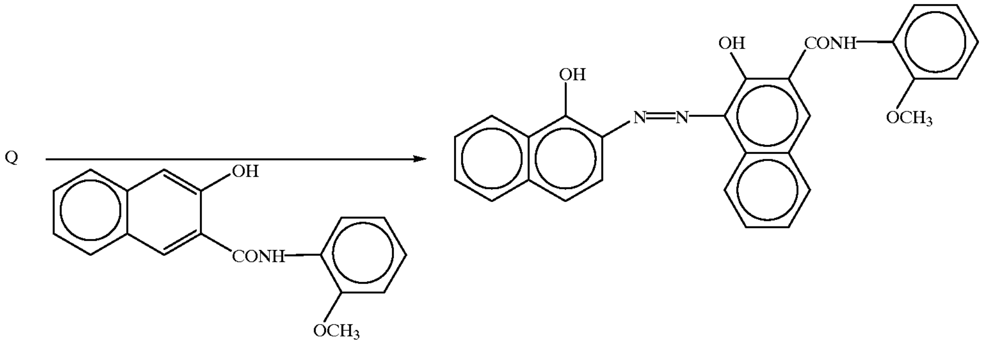

(α13)

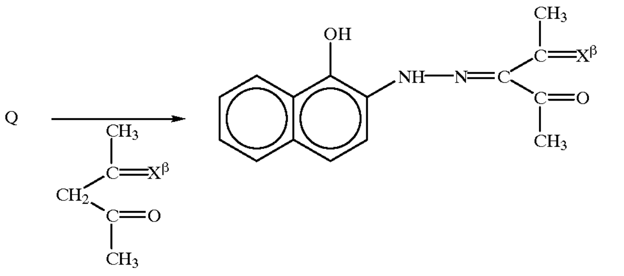

($X^{\beta}$ is N—H, N—$CH_3$ or oxygen.)

(α14)

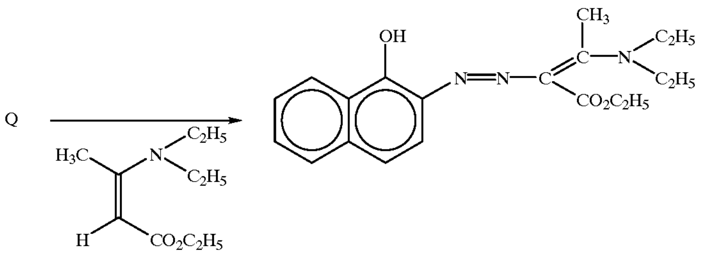

Preferred resins obtainable by the above-mentioned non-sensitizing of resins containing o-quinonediazide groups, will be given below.

(1) A coupling reaction product of o-quinonediazide groups of a resin with a compound (a non-aromatic coupler) having active hydrogen of the following formula (A) or (B):

(A)

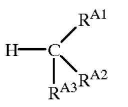

wherein each of $R^{A1}$ to $R^{A3}$ which are independent of one another, is an alkyl group, a hydrogen atom, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of $R^{A1}$ to $R^{A3}$ is a group selected from an acyl group, an alkoxycarbonyl group, an aryloxycarbonyl group, an allyloxycarbonyl group, a carboxylic acid group and a cyano group.

(B)

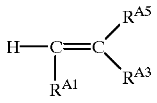

wherein $R^{A1}$ and $R^{A3}$ are as defined in (A), and $R^{A5}$ represents one represented by $R^{A3}$ in (A) or an amino group which may have a substituent.

(2) A coupling reaction product of o-quinonediazide groups of a resin with a mono- to tri-cyclic aryl compound (an aromatic coupler) which has at least a hydroxyl group or a nitro group and which may further have other substituents, as disclosed in e.g. Dyestuff Handbook (compiled by Organic Synthetic Chemistry Association, 1959, published by Maruzen K. K.), or "ORGAMC INTERMEDIATES", (catalogue of Daito Chemical Industry Co., Ltd.).

(3) A compound having a hydroxyl group or an alkoxy group as a substituent, which is obtainable by inducing a nitrogen-removal reaction together with a compound having a hydroxyl group such as an alcohol in the presence of an acid or an alkali (a nitrogen-removal reaction product).

Specific examples of the couplers will be given.

(1) Non-aromatic couplers

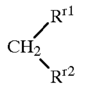

| $R^{x1}$ | $R^{r2}$ |
|---|---|
| $—COCH_3$ | $—CO_2C_2H_5$ |
| —CN | $—CO_2C_2H_5$ |
| $—CO_2C_2H_5$ | $—CO_2C_2H_5$ |
| 2.4-Dinitrophenyl | $—CO_2C_2H_5$ |
| $—COCH_2CO_2CH_3$ | $—CO_2CH_3$ |
| $—NO_2$ | $—CO_2C_2H_5$ |
| $—CO_2H$ | $—CO_2H$ |
| $—COCH_3$ | $—COCH_3$ |
| 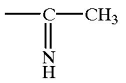 | $—CO_2C_2H_5$ |
| —CN | —CN |
| 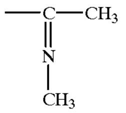 | $—CO_2C_2H_5$ |

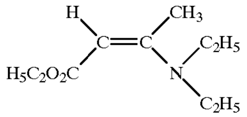

(2) Aromatic couplers

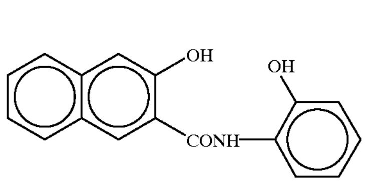

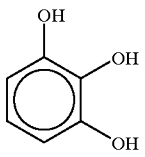

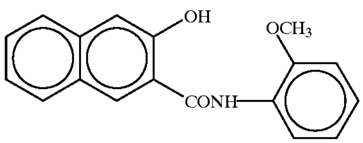

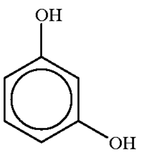

-continued

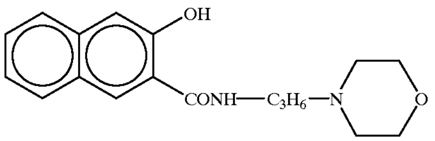

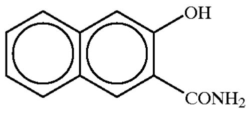

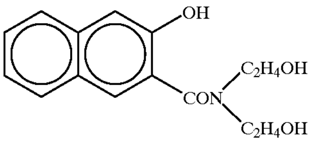

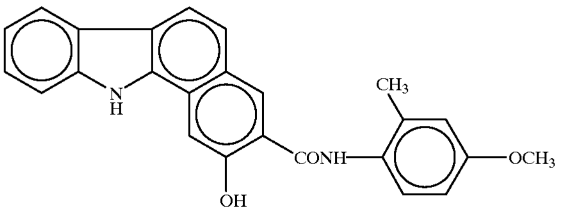

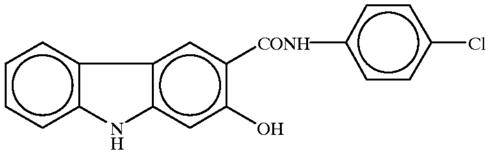

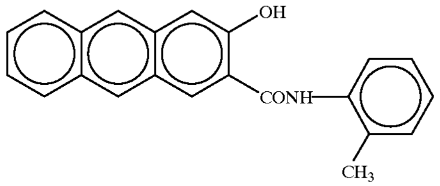

When the stain resistance is taken into consideration, particularly preferred is one wherein the esterified alkali soluble resin (a-1) is an ester of a novolak resin with a sulfonic acid compound and R in the ester moiety ($R—SO_3—$) of the sulfonic acid ester is represented by the following formula:

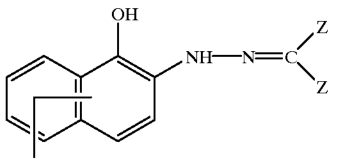

wherein each of two Z which are independent of each other, is a hydrogen atom, an alkyl group, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of them is a group selected from an acyl group, an alkoxycarbonyl group, an aryloxycarbonyl group, an allyloxycarbonyl group, a carboxylic acid group and a cyano group.

Specific examples of the resin having o-quinonediazide groups non-sensitized, to be used in the present invention, will be given below. However, the non-sensitized o-quinonediazide derivatives to be used in the present invention are not limited to these compounds.

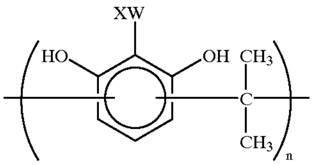

MW 4000

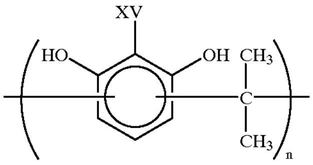

MW 4000

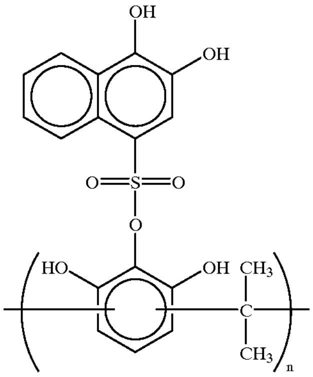

MW 4000

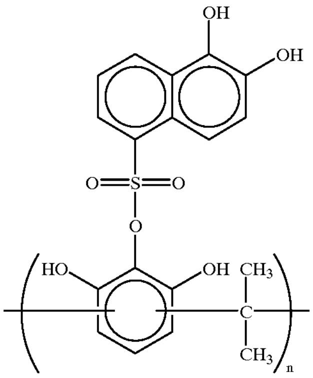

MW 4000

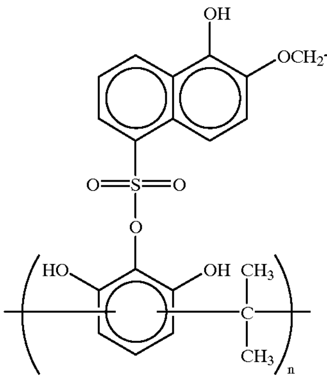

MW 4000

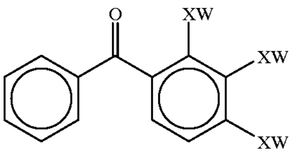

-continued

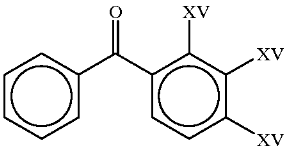

A compound (Mw 3000) having XW substituted for hydroxyl groups of a polycondensation novolak resin of m-cresol with formaldehyde (reaction ratio: 30%).

A compound (Mw 3000) having XV substituted for hydroxyl groups of a polycondensation novolak resin of m-cresol with formaldehyde (reaction ratio: 30%).

A compound (Mw 2000) having XW substituted for hydroxyl groups of a polycondensation novolak resin of phenol with formaldehyde (reaction ratio: 30%).

A compound (Mw 3000) having XV substituted for hydroxyl groups of a polycondensation novolak resin of m-resorcinol with formaldehyde (reaction ratio: 20%).

A compound (Mw 3000) having XW substituted for hydroxyl groups of a polycondensation novolak resin of m-resorcinol with formaldehyde (reaction ratio: 20%).

XW:

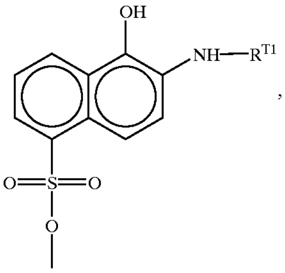

,

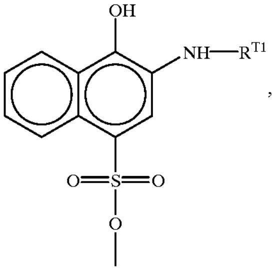

, or

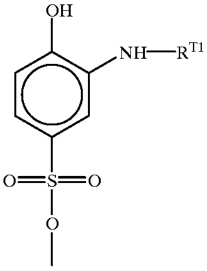

($R^{T1}$ is

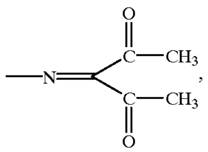

,

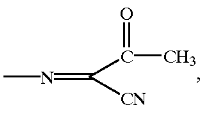

,

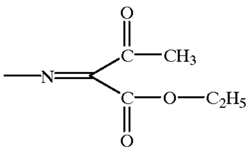

or

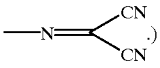

.)

-continued

XV:

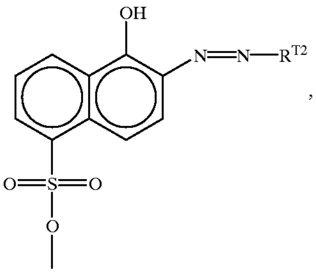

,

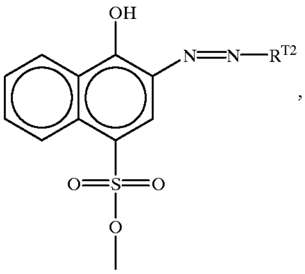

, or

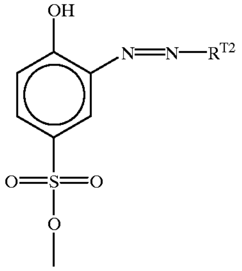

($R^{T2}$ is

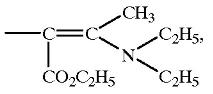

,

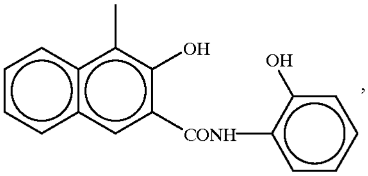

,

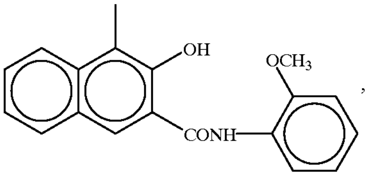

,

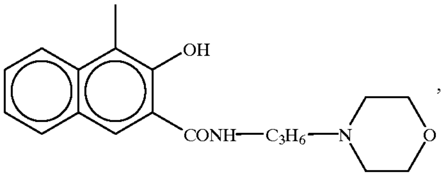

,

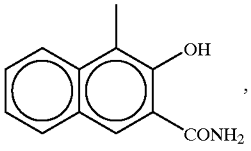

,

-continued

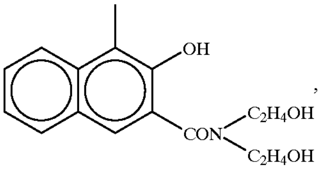

,

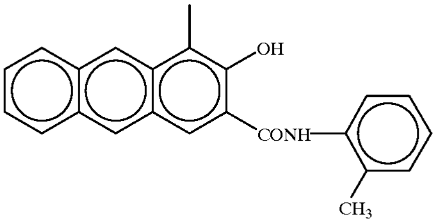

or

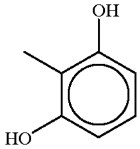

.)

When the above described esterified alkali-soluble resin (a-1) is to be used for the present invention in combination with the non-esterified alkali-soluble resin, the weight ratio of the esterified alkali-soluble resin (a-1) to the non-esterified alkali-soluble resin is preferably from 1:1 to 1:100, more preferably from 1:2 to 1:50. As a result of such a combined use, usually from 1 to 40% of phenolic hydroxyl groups in the alkali-soluble resin having the phenolic hydroxyl groups in the positive photosensitive composition will be as esterified. The esterification ratio is preferably from 2 to 30%, more preferably from 5 to 15%.

Further, so long as the esterification ratio is within the above range, it is possible to employ one obtained by wholly esterifying the resin component in the positive photosensitive composition.

Further, the positive photosensitive composition of the present invention may contain a certain solubility-suppressing agent which forms a hydrogen bond with the alkali-soluble resin having phenolic hydroxyl group (a) and has a function of lowering the solubility of the alkali-soluble resin having phenolic hydroxyl group (a) and which does not substantially absorb near infrared light i.e. has an absorption efficiency of not more than 1% of near infrared light and is not decomposed by infrared light, for the purpose of further increasing the difference in solubility as between the exposed portion and the non-exposed portion.

The solubility-suppressing agent to be used in the present invention may, for example, be an acid anhydride, a sulfonic acid ester, a phosphoric acid ester, an aromatic carboxylic acid ester, an aromatic ketone, an aromatic aldehyde, an aromatic amine or an aromatic ether as disclosed in JP9-205789, a nonionic surfactant or a fluorine type surfactant as disclosed in JP9-301915, an acid-color forming dye as disclosed in JP9-291880, or a base-color developing dye as disclosed in JP9-301915. The blend ratio of such a solubility-suppressing agent is usually from 0 to 50 wt %, preferably from 0 to 30 wt %, more preferably from 0 to 20 wt %, based on the total solid content in the photosensitive composition.

Further, the photosensitive layer may contain a colorant other than the photo-thermal conversion material, as the case requires. The colorant may be a pigment or a dye such as Victoria Pure Blue (42595), Auramine O (41000), Catiron Brilliant Flavin (basic 13), Rhodamine 6GCP (45160), Rhodamine B (45170), Safranine OK 70:100 (50240), Erioglaucine X (42080), Fast Black HB (26150), No. 120/ Lionol Yellow (21090), Lionol Yellow GRO (21090), Simular Fast Yellow 8GF (21105), Benzidine Yellow 4T-564D (21095), Simular Fast Red 4015 (12355), Lionol Red B4401 (15850), Fastgen Blue-TGR-L (74160) or Lionol Blue SM (26150), crystal violet lactone. Here, numerals in the brackets indicate the color indices (C.I.).

The blend ratio of the colorant is usually from 0 to 50 wt %, preferably from 1 to 30 wt %, based on the solid content of the entire positive photosensitive composition.

The photosensitive composition of the present invention has no UV sensitivity and thus is easy to handle under white light. Accordingly, as the above-mentioned optional additive components, it is necessary to select components which have no sensitivity to UV light. The photosensitive composition having no UV sensitivity means that the composition has such a nature that even when irradiated with UV light, particularly with a light within a range of from 360 to 450 nm, the exposed portion will not be substantially alkali-soluble, i.e. there will be no significant difference in the solubility in the alkali developer.

More specifically, even when left to stand under white fluorescent light (36 W white fluorescent lamp Neolumi Super FLR40S-W/M/36, manufactured by Mitsubishi Denki K.K.) with a light intensity of 400 lux for 10 hours, the positive photosensitive composition (the photosensitive layer of the positive photosensitive material) shows no change in the solubility.

The positive photosensitive composition of the present invention is used usually in the form of a solution having the above-described various components dissolved in a suitable solvent. The solvent is not particularly limited so long as it presents adequate solubility to the components used and provides an excellent coating property. For example, it may be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl lactate, butyl lactate, diethyl oxalate, ethyl pyruvate, ethyl-2-hydroxy butyrate, ethyl acetoacetate, methyl lactate, ethyl lactate or methyl 2-methoxypropionate, an alcohol solvent such as heptanol, hexanol, diacetone alcohol or furfuryl alcohol, a ketone solvent such as cyclohexanone or methyl amyl ketone, a highly polar solvent such as dimethylformamide, dimethylacetamide or N-methylpyrrolidone or a solvent mixture thereof, or a mixture thereof with an aromatic hydrocarbon. The proportion of the solvent is usually within a range of from 1 to 200 times by weight, to the total amount of the photosensitive composition.

Further, the positive photosensitive composition of the present invention may contain various additives, such as a coating property-improving agent, a development-improving agent, an adhesion-improving agent, a sensitivity-improving agent and an oleophilic agent in a range not to impair the desired properties.

The photosensitive composition of the present invention is coated on a substrate and thus advantageously used as a lithographic printing plate. As the coating method to be employed for forming a photosensitive layer on the substrate surface, a conventional method such as rotational coating, wire bar coating, dip coating, air knife coating, roll coating, blade coating or curtain coating may, for example, be employed. As the drying conditions, a temperature of from 60 to 170° C. for from 5 seconds to 10 minutes, preferably a temperature of from 70 to 150° C. for from 10 seconds to 5 minutes, may, for example, be employed.

The thickness of the photosensitive layer is usually from 0.3 to 7 $\mu$m, preferably from 0.5 to 5 $\mu$m, more preferably from 1.0 to 3 $\mu$m.

The substrate on which the photosensitive layer is formed, may, for example, be a metal plate of e.g. aluminum, zinc, copper or steel, a metal plate having chromium, zinc, copper, nickel, aluminum or iron plated or vapor-deposited thereon, a paper sheet, a paper sheet having a resin coated thereon, a paper sheet having a metal foil of e.g. aluminum bonded thereto, a plastic film, a plastic film having hydrophilic treatment applied thereto, or a glass plate. As a substrate for a lithographic printing plate, preferred is an aluminum plate having grain treatment applied by brush polishing or electrolytic etching in a hydrochloric acid or nitric acid solution, having anodizing treatment applied in a sulfuric acid solution and, if necessary, having surface treatment such as pore sealing treatment applied. When an aluminum substrate is used as the substrate, any conventional aluminum substrate commonly used for printing plates may be employed, such as a A1000 (pure aluminum) type, a A3000 (Al-Mn) type or a A5000 (Al-Mg) type, as stipulated in JIS.

The roughness of a substrate surface is usually represented by a value of surface roughness Ra, which can be measured by means of a surface roughness meter. The substrate to be used in the present invention is preferably an aluminum plate having an average surface roughness of from 0.3 to 1.0 $\mu$m, preferably from 0.4 to 0.8 $\mu$m.

The substrate may further be subjected to surface treatment with an organic compound, as the case requires.

The light source for image exposure of the positive photosensitive composition of the present invention, may, for example, be a lamp light source such as a xenon lamp, a high pressure mercury lamp, a low pressure mercury lamp, a halogen lamp or a metal halide lamp, or a laser light source such as a HeNe laser, an argon ion laser, a YAG laser, a HeCd laser, a semiconductor laser or a ruby laser. Especially when an image is to be formed by heat generated upon absorption of light, it is preferred to employ a light source capable of generating a near infrared laser beam of from 650 to 1,300 nm, such as a ruby laser, a YAG laser, a semiconductor laser or a solid laser such as LED, particularly preferably a semiconductor laser or a YAG laser, which is small in size and has a long useful life. With such a laser light source, scanning exposure is usually carried out, and then development is carried out with a developer to form an image.

The laser light source is used to scan the surface of the photosensitive layer usually in the form of a high intensity light ray (beam) focused by a lens, and the sensitivity characteristic ($mJ/cm^2$) of the positive lithographic printing plate of the present invention responding thereto may sometimes depend on the light intensity ($mJ/s \cdot cm^2$) of the laser beam received by the photosensitive layer surface. Here, the light intensity ($mJ/s \cdot cm^2$) of the laser beam can be obtained by measuring the energy per unit time ($mJ/s \cdot cm^2$) of the laser beam on the printing plate by a light power meter, or by measuring the beam diameter (irradiation area: $cm^2$) on the photosensitive layer surface, and dividing the energy per unit time by the irradiation area. The irradiation area of the laser beam is usually defined by the area of the portion exceeding $1/e^2$ intensity of the laser peak intensity, but it may simply be measured by sensitizing the photosensitive material showing reciprocity law.

In the present invention, the light intensity of the light source is preferably at least $2.0 \times 10^6$ $mJ/s \cdot cm^2$, more preferably at least $1.0 \times 10^7$ $mJ/s \cdot cm^2$. If the light intensity is within the above range, it is possible to improve the sensitivity characteristic of the positive photosensitive composition of the present invention, and the scanning exposure time can be shortened, such being practically very advantageous.

Now, the present invention will be described in further detail with reference to Examples. However, it should be understood that the present invention is by no means restricted to such specific Examples.

EXAMPLES 1 to 7 AND COMPARATIVE EXAMPLES 1 to 3

A photosensitive liquid comprising the following components, was coated on a hydrophilic grain surface-treated aluminum plate having a thickness of 0.24 mm, by a wire bar and dried at 100° C. for 1 minute, followed by heat treatment at 55° C. for 16 hours to obtain a lithographic printing plate. The coating film amount was 2.5 $g/m^2$.

Photosensitive Liquid

Non-esterified alkali-soluble resin:

novolak resin (Mw 7000) having cresol/m-cresol/p-cresol (molar ratio of 20/50/30) copolycondensed with formaldehyde 100 parts by weight Photo-thermal conversion material:

SA-1 as described hereinafter 4 parts by weight

Esterified alkali-soluble resin or other additives:

As identified in Table A 10 parts by weight

Colorant:

As identified in Table A 7 parts by weight

Solvent:

Cyclohexanone 900 parts by weight

Photo-Thermal Conversion Material

SA-1

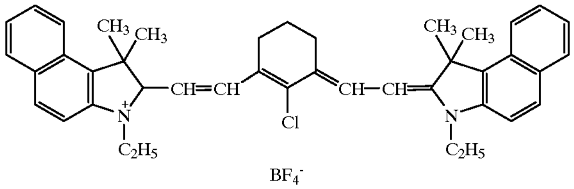

Colorant

SB-1 Crystal violet lactone

Esterified Alkali-Soluble Resin

SC-1

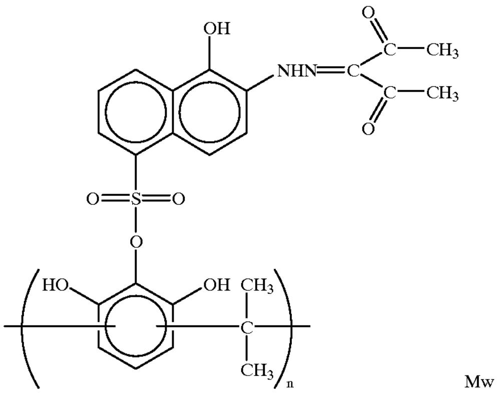

Mw 4000

SC-2

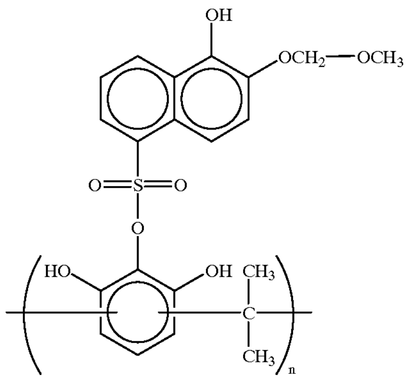

Mw 4000

-continued
SC-3
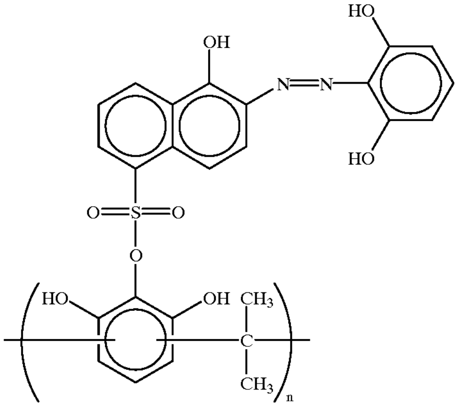
Mw 4000
SC-4
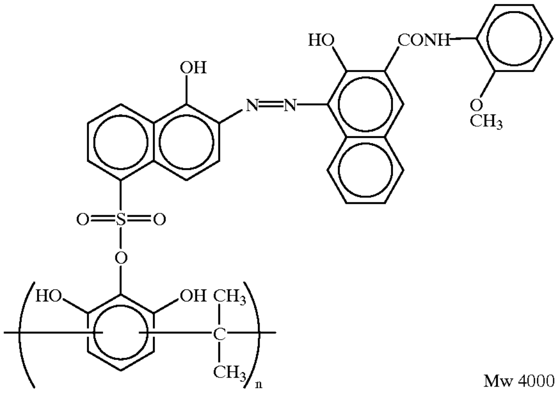
Mw 4000
SC-5
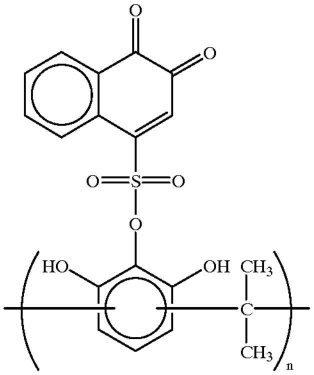
Mw 4000
-continued
SC-6
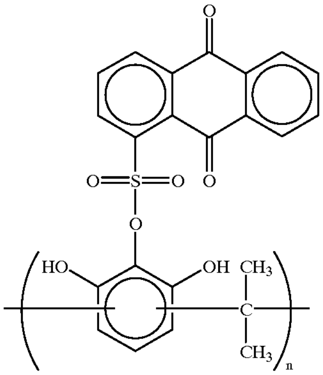
Mw 4000
SC-7
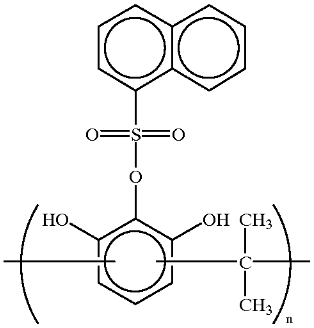
Mw 4000
TC-1
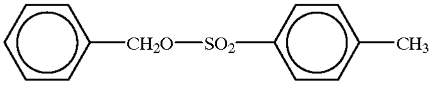
TC-2
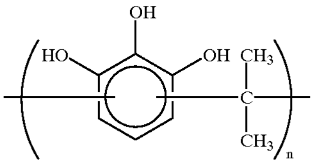
Mw 4000
TC-3
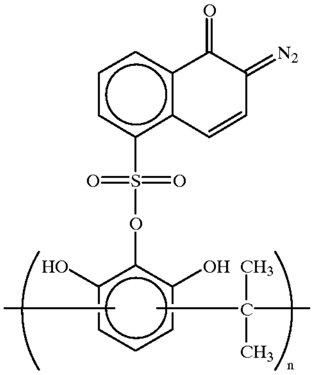
Mw 4000

Then, the above sample was subjected to image exposure to form 212 lines and 3 to 97% dot images with an exposure of 200 mJ/cm$^2$ by means of an exposure apparatus for lithographic printing plates using a semiconductor laser of 830 nm as the light source ("Trend Setter 3244T", manufactured by Creo Products Inc.) and then developed with an alkali developer (DP-4 manufactured by Fuji Photo Film Co., Ltd. diluted from 6 to 10 times) at 28° C. to reproduce the 3 to 97% dot images thereby to obtain a printing plate. Using the printing plate, the following evaluations were carried out, and the results are shown in Table A.

Printing Resistance 50,000 copies were printed by the printing plate by means of a printing machine Dia 1F-2, manufactured by Mitsubishi Heavy Industries, Ltd., wetting water (Astro No. 1 Mark 2 (1% liquid, pH 5, 10° C.) manufactured by Nikken Kagaku K.K., an ink (High Echo Beni, manufactured by Toyo Ink) and printing paper (OK toku Art, manufactured by Oji Paper Co., Ltd.), and then the ink on the printing plate was removed with a plate cleaner (SK Plate Cleaner, manufactured by SK Co., Ltd.), whereupon a gum (SGW) manufactured by Konica K.K. was coated on the surface of the printing plate and left to stand for 12 hours (plate-leaving treatment), whereupon 50,000 copies were again printed.

From the printable number of copies, the printing resistance of the printing plate was evaluated.

A: Number of printed copies being at least 50,000 copies

B: Number of printed copies being at least 30,000 and less than 50,000 copies

C: Number of printed copies being at least 10,000 and less than 30,000 copies

D: Number of printed copies being less than 10,000 copies

Chemical Resistance

A part of the printed plate was dipped in Matsui washing oil (manufactured by Matsui Kagaku K.K.) for 1 minute to examine the chemical resistance. With respect to the image area, the film-remaining ratio after dipping was obtained from the reflection densities from the dipped portion and the non-dipped portion.

Film-remaining ratio: The reflection densities before and after the dipping of the image area after development were measured by a reflection densitometer manufactured by Macbeth Co., and the results calculated by the following formula were represented by A to D.

$$\text{Film remaining ratio (\%)} = \frac{\text{Reflection density of the image area after dipping} - \text{Reflection density of the non-image area}}{\text{Reflection density of the image area before dipping} - \text{Reflection density of the non-image area}}$$

A: A film-remaining ratio of 100%.

B: A film-remaining ratio of at least 80% and less than 100%.

C: A film-remaining ratio of at least 50% and less than 80%.

D: A film-remaining ratio of less than 50%.

TABLE A

| Example | Esterified alkali soluble-resin or other additives* | Chemical resistance | Colorant | Printing resistance |
|---|---|---|---|---|
| 1 | SC-1 | A | SB-1 | A |
| 2 | SC-2 | A | SB-1 | A |
| 3 | SC-3 | A | SB-1 | A |
| 4 | SC-4 | A | SB-1 | A |
| 5 | SC-5 | A | SB-1 | A |
| 6 | SC-6 | A | SB-1 | A |
| 7 | SC-7 | A | SB-1 | A |
| Comparative Example 1 | — | D | SB-1 | D |
| Comparative Example 2 | TC-1 | D | SB-1 | D |
| Comparative Example 3 | TC-2 | D | SB-1 | A |

Especially from a comparison with the above Comparative Example 2, it is evident that when an esterified alkali-soluble resin is used as the additive, the chemical resistance and the printing resistance are remarkably improved over a case where a low molecular weight ester compound is used.

REFERENCE EXAMPLE 1

The sample of Example 1 was left to stand for 10 hours under white fluorescent light with 400 lux, and then plate making was carried out in the same manner to obtain a similar printing plate, whereby exactly the same evaluation results were obtained.

COMPARATIVE EXAMPLE 4

A sample prepared in the same manner as in Example 1 except that as the additive, instead of the esterified alkali-soluble resin SC-1, TC-3 was used, was evaluated in the same manner as in Example 1, whereby both the chemical resistance and the printing resistance were A.

On the other hand, a sample separately prepared in the same manner, was left to stand for 2 hours under white fluorescent light with 400 lux, and then plate making was attempted in the same manner, whereby the entire photosensitive layer dissolved in the alkali developer, and it was impossible to obtain a printing plate. Namely, this indicates that with the sample of this Comparative Example, handling under white light is restricted.

TC-3 is a kind of an esterified alkali-soluble resin, but at the same time, it is an o-quinonediazide compound. Therefore, it does not fall within the scope of the esterified alkali-soluble resin to be employed in the present invention.

EXAMPLE 8

A gum (SGW) manufactured by Konica K.K. was coated on the surface of a printed plate obtained by exposure and development in the same manner as in Example 1, and left to stand for 12 hours, to obtain a printing plate. Printing was carried out by this printing plate in the same manner as in Example 1, and the printed product of the 500th copy was visually inspected, whereby the printed product was of high quality free from deposition of ink at the non-image area.

REFERENCE EXAMPLE 2

Using the printing plate obtained in Example 5, printing was carried out in the same manner as in Example 8, and the printed product of the 500th copy was visually inspected, whereby deposition of ink was observed at the non-image area.

REFERENCE EXAMPLE 3

Using the printing plate obtained in Example 6, printing was carried out in the same manner as in Example 8, and the printed product of the 500th copy was visually inspected, whereby deposition of ink was observed at the non-image area.

COMPARATIVE EXAMPLE 5

Using the printing plate before leaving under white light, obtained in Comparative Example 4, printing was carried out in the same manner as in Example 8, and the printed product of the 500th copy was visually inspected, whereby deposition of ink was observed at the non-image area.

EXAMPLES 9 to 12 and COMPARATIVE EXAMPLE 6

A lithographic printing plate was prepared in the same manner as in Example 1 except that the photosensitive liquid was changed to the following composition. The coating film amount was 2.5 g/$m^2$.

Photosensitive Liquid

Non-esterified alkali-soluble resin:

Novolak resin (Mw 7000) having phenol/m-cresol/p-cresol (molar ratio of 20/50/30) copolycondensed with formaldehyde 100 parts by weight Photo-thermal conversion material:

SA-1 as mentioned above 4 parts by weight

Esterified alkali-soluble resin:

As identified in Table B 20 parts by weight

Colorant:

SB-1 as mentioned above 10 parts by weight

Solvent:

Cyclohexanone 900 parts by weight

The obtained lithographic printing plate was subjected to exposure and development in the same manner as in Example 1, and the printing resistance was evaluated in the same manner.

The printing resistance of the printing plate was evaluated from the printable number of copies.

A: Number of printed copies being at least 100,000 copies

B: Number of printed copies being at least 50,000 and less than 100,000 copies

C: Number of printed copies being at least 10,000 and less than 50,000 copies

D: Number of printed copies being less than 10,000 copies

The chemical resistance was evaluated in the same manner as in Example 1. The results are shown in Table B.

TABLE B

| Example | Esterified alkali soluble-resin | Chemical resistance | Printing resistance |
|---|---|---|---|
| 9 | SC-1 | A | A |
| 10 | SC-2 | A | A |
| 11 | SC-3 | A | A |
| 12 | SC-4 | A | A |
| Comparative Example 6 | — | D | D |

The positive photosensitive composition containing an esterified alkali-soluble resin of the present invention has excellent sensitivity characteristics, and it is possible to provide a positive photosensitive composition which is excellent in the printing resistance and chemical resistance of the image portion when used as a photosensitive layer for a printing plate and a photosensitive lithographic printing plate employing such a composition.

Particularly, it is possible to provide a positive photosensitive lithographic printing plate which is excellent in the above properties especially by means of an infrared beam and which is processable under white light. Further, by selecting the printing resistance-improving agent, it is possible to provide a lithographic printing plate having the stain resistance improved.

What is claimed is:

1. A positive photosensitive composition comprising an alkali-soluble resin having phenolic hydroxyl groups (a) and a photo-thermal conversion material (b), and not containing a quinonediazide compound, which contains an alkali-soluble resin having phenolic hydroxyl groups, of which at least some are esterified (a-1).

2. The positive photosensitive composition according to claim 1, wherein from 2 to 30% of the phenolic hydroxyl groups in the alkali-soluble resin component having phenolic hydroxyl groups, of the positive photosensitive composition are esterified.

3. The positive photosensitive composition according to claim 1, wherein the weight ratio of the esterified alkali-soluble resin (a-1) to the non-esterified alkali-soluble resin in the photosensitive composition is from 1:1 to 1:100.

4. The positive photosensitive composition according to claim 3, wherein the esterified alkali-soluble resin (a-1) has a weight average molecular weight of from 1,000 to 50,000.

5. The positive photosensitive composition according to claim 1, wherein the esterified alkali-soluble resin (a-1) is a resin having such a structure that phenolic hydroxyl groups of an alkali-soluble resin having phenolic groups are esterified with a sulfonic acid compound or a carboxylic acid compound.

6. The positive photosensitive composition according to claim 1, wherein the alkali-soluble resin having phenolic hydroxyl groups which constitutes the esterified alkali-soluble resin (a-1), is a novolak resin.

7. The positive photosensitive composition according to claim 3, wherein the esterified alkali-soluble resin (a-1) is a resin wherein from 10 to 40% of the phenolic hydroxyl groups are esterified.

8. The positive photosensitive composition according to claim 1, wherein the esterified alkali-soluble resin (a-1) is a resin having such a structure that phenolic hydroxyl groups of an alkali-soluble resin having phenolic groups are esterified with a sulfonic acid compound, and the sulfonic acid compound is a mono- to tri-cyclic aryl sulfonic acid or a mono- to tri-cyclic quinone sulfonic acid, which may have, as a substituent, an alkyl group, a carboxylic acid group, a hydroxyl group or a primary to tertiary amino group, or a carboxylic acid thereof.

9. The positive photosensitive composition according to claim 1, wherein the esterified alkali-soluble resin (a-1) is a resin having such a structure that phenolic hydroxyl groups of an alkali-soluble resin having phenolic groups are esterified with a sulfonic acid compound, and R in the sulfonic acid ester ($R—SO_3—$) has a structure of the following formula:

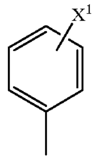
,
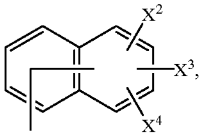
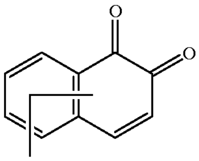
or

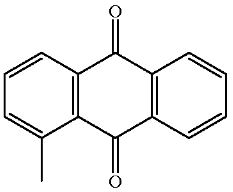

wherein $X^1$ is a hydrogen atom or an alkyl group, $X^2$ is a hydrogen atom or a hydroxyl group, $X^3$ is

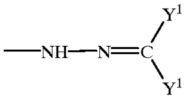

or —N═N—$Y^2$, $X^4$ is a hydrogen atom or an alkyl group, each of two $Y^1$ which are independent of each other, is a hydrogen atom, an alkyl group, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of them is a group selected from an acyl group, an alkoxycarbonyl group, an aryloxycarbonyl group, an allyloxycarbonyl group, a carboxylic acid group and a cyano group, and $Y^2$ is an aryl group which may have a substituent, an alkyl group which may have a substituent, a heterocyclic group which may have a substituent, an alkenyl group, an acyl group which may have a substituent, or an alkoxycarbonyl group which may have a substituent.

10. The positive photosensitive composition according to claim 9, wherein R in the sulfonic acid ester ($R—SO_3—$) has a structure of the following formula:

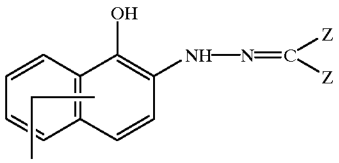

wherein each of two Z which are independent of each other, is a hydrogen atom, an alkyl group, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of them is a group selected from an acyl group, an alkoxycarbonyl group, an aryloxycarbonyl group, an allyloxycarbonyl group, a carboxylic acid group and a cyano group.

11. The positive photosensitive composition according to claim 1, wherein the esterified alkali-soluble resin (a-1) is a resin having such a structure that phenolic hydroxyl groups of an alkali-soluble resin having phenolic groups are esterified with an arylsulfonic acid compound which may have a substituent, and the aromatic ring or a substituent on the aromatic ring of the arylsulfonic acid is substituted by a hydrophilic group.

12. The positive photosensitive composition according to claim 11, wherein the hydrophilic group is a group selected from a hydroxyl group, an amino group which may be substituted, and a carboxylic acid group.

13. The positive photosensitive composition according to claim 11, wherein the aromatic ring of the arylsulfonic acid is substituted by at least a hydroxyl group.

14. The positive photosensitive composition according to claim 13, wherein the esterified alkali-soluble resin (a-1) is a resin having hydroxyl groups introduced by a reaction of o-quinonediazide groups of an ester of an alkali-soluble resin having phenolic hydroxyl groups with o-quinonediazide sulfonic acid, wherein the reaction of the o-quinonediazide groups is a couling reaction with an active hydrogen-containing compound or a nitrogen-removing reaction.

15. The positive photosensitive composition according to claim 14, wherein the reaction of the o-quinonediazide groups is a coupling reaction with an active hydrogen-containing compound of the following formula:

(A)

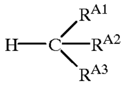

wherein each of $R^{A1}$ to $R^{A3}$ which are independent of one another, is a hydrogen atom, an alkyl group, an aryl group, a chlorine atom, a bromine atom, an iodine atom, a fluorine atom, an alkoxy group, an aryloxy group, an acyl group, an alkoxycarbonyl group, an aryloxycarbonyl group, an allyloxycarbonyl group, a carboxylic acid group or a cyano group, provided that at least one of them is a group selected from an acyl group, an alkoxycarbonyl group, an aryloxycarbonyl group, an allyloxycarbonyl group, a carboxylic acid group and a cyano group.

16. The positive photosensitive composition according to claim 3, wherein the non-esterified alkali-soluble resin is a novolak resin.

17. The positive photosensitive composition according to claim 3, wherein the non-esterified alkali-soluble resin has a weight average molecular weight of from 1,000 to 1,000,000.

18. The positive photosensitive composition according to claim 1, wherein the photo-thermal conversion material (b) is a cyanine dye having a near infrared absorptivity.

19. A positive photosensitive composition comprising an alkali-soluble resin having phenolic hydroxyl groups, of which at least some are esterified (a-1), a non-esterified alkali-soluble resin and a photo-thermal conversion material, which has substantially no photosensitivity to ultraviolet light.

20. A positive photosensitive composition comprising an alkali-soluble resin having phenolic hydroxyl groups, of which at least some are esterified (a-1), a non-esterified alkali-soluble resin and a photo-thermal conversion material, of which the solubility in an alkali developer does not change when it is left to stand under white light with a light intensity of 400 lux for 10 hours.

21. A positive photosensitive lithographic printing plate having a layer of the positive photosensitive composition as defined in claim 1 formed on a substrate.

22. A method for forming a positive image, which comprises subjecting the photosensitive lithographic printing plate as defined in claim 21 to exposure with a laser beam having a wavelength within a range of from 650 to 1,300 nm, and then developing it with an alkali developer to form a positive image.

* * * * *